(12) United States Patent
Schwartz et al.

(10) Patent No.: US 11,561,251 B2
(45) Date of Patent: Jan. 24, 2023

(54) REMOTE AUTONOMOUS INSPECTION OF UTILITY SYSTEM COMPONENTS UTILIZING DRONES AND ROVERS

(71) Applicant: Florida Power & Light Company, Juno Beach, FL (US)

(72) Inventors: Eric D. Schwartz, Palm Beach Gardens, FL (US); Stephen S. Cross, North Palm Beach, FL (US); Bryan M. Kitchener, Boynton Beach, FL (US)

(73) Assignee: Florida Power & Light Company, Juno Beach, FL (US)

( * ) Notice: Subject to any disclaimer, the term of this patent is extended or adjusted under 35 U.S.C. 154(b) by 690 days.

(21) Appl. No.: 16/051,664

(22) Filed: Aug. 1, 2018

(65) Prior Publication Data

US 2020/0041560 A1    Feb. 6, 2020

(51) Int. Cl.

| | |
|---|---|
| *G01R 31/08* | (2020.01) |
| *B64C 39/02* | (2006.01) |
| *G06Q 50/06* | (2012.01) |
| *G06N 3/08* | (2006.01) |

(52) U.S. Cl.
CPC .......... *G01R 31/086* (2013.01); *B64C 39/024* (2013.01); *G01R 31/085* (2013.01); *G06N 3/08* (2013.01); *G06Q 50/06* (2013.01); *B64C 2201/127* (2013.01)

(58) Field of Classification Search
CPC .... G01R 31/086; G01R 31/085; B64C 39/024
See application file for complete search history.

(56) References Cited

U.S. PATENT DOCUMENTS

| | | | |
|---|---|---|---|
| 6,056,237 A | 5/2000 | Woodland | |
| 8,849,680 B2 | 9/2014 | Wright et al. | |
| 8,909,391 B1 | 12/2014 | Peeters et al. | |
| 9,152,863 B1 | 10/2015 | Grant | |
| 9,162,753 B1 | 10/2015 | Panto et al. | |
| 9,382,003 B2 | 7/2016 | Burema et al. | |
| 9,505,494 B1 | 11/2016 | Marlow et al. | |

(Continued)

FOREIGN PATENT DOCUMENTS

| | | |
|---|---|---|
| CN | 105141889 | 12/2015 |
| GB | 2552092 | 1/2018 |

(Continued)

OTHER PUBLICATIONS

Moraru et al, Using Machine Learning on Sensor Data, 2010, Journal of Computing and Information Technology—CIT 18, 2010, 4, 341-347 (Year: 2010).*

(Continued)

*Primary Examiner* — Lisa E Peters
(74) *Attorney, Agent, or Firm* — Fleit Intellectual Property Law; Thomas S. Grezsik

(57) ABSTRACT

Unmanned monitoring devices, such as unmanned aerial vehicles (UAV), drones or rovers may inspect system components within an area of interest (AOI) such an electric power distribution system including generation, transmission, and distribution elements for autonomous detection of damage to the components. Work orders for repairing the damage are autonomously generated and resources identified within the work orders are autonomously provisioned.

20 Claims, 12 Drawing Sheets

(56) References Cited

U.S. PATENT DOCUMENTS

| | | | |
|---|---|---|---|
| 9,663,226 B2 | 5/2017 | Canavor et al. | |
| 9,742,165 B2 | 8/2017 | Hyde et al. | |
| 9,745,060 B2 | 8/2017 | O'Connor et al. | |
| 9,778,661 B2 | 10/2017 | Wang et al. | |
| 9,805,261 B1 | 10/2017 | Loveland et al. | |
| 9,805,456 B1 | 10/2017 | Harvey et al. | |
| 9,849,979 B2 | 12/2017 | Peeters et al. | |
| 9,881,213 B2 | 1/2018 | Michini et al. | |
| 2002/0065698 A1* | 5/2002 | Schick | G07C 5/0841 705/333 |
| 2009/0265193 A1 | 10/2009 | Collins et al. | |
| 2011/0130636 A1 | 6/2011 | Daniel et al. | |
| 2014/0120972 A1 | 5/2014 | Hartman | |
| 2016/0063642 A1 | 3/2016 | Luciani et al. | |
| 2016/0155073 A1* | 6/2016 | Augenstein | B64G 1/1021 705/7.24 |
| 2016/0282872 A1* | 9/2016 | Ahmed | G05D 1/106 |
| 2016/0306355 A1 | 10/2016 | Gordon et al. | |
| 2017/0083830 A1* | 3/2017 | Bates | G06N 20/00 |
| 2017/0116558 A1 | 4/2017 | Pierz et al. | |
| 2017/0329297 A1* | 11/2017 | Gilman | G05B 19/042 |
| 2017/0337524 A1 | 11/2017 | Durand et al. | |
| 2017/0358068 A1* | 12/2017 | Strebel | G01S 17/89 |
| 2017/0372259 A1* | 12/2017 | Lesser | G05D 1/0676 |
| 2018/0046172 A1 | 2/2018 | Tao et al. | |
| 2018/0074499 A1* | 3/2018 | Cantrell | G05D 1/0088 |
| 2018/0095123 A1* | 4/2018 | Biswas | G01R 25/005 |
| 2018/0314994 A1* | 11/2018 | Katz | G06Q 10/0631 |
| 2018/0330027 A1* | 11/2018 | Sen | B08B 13/00 |

FOREIGN PATENT DOCUMENTS

| | | |
|---|---|---|
| WO | 2014058337 | 4/2014 |
| WO | 2017048543 | 3/2017 |

OTHER PUBLICATIONS

Reese et al, Understanding the differences beteween AI, machine learning, and deep learning, TechRepublic, pp. 1-4 (Year: 2017).*

Fong et al., Vehicle Teleoperation Interfaces, Autonomous Robots, Sep. 18, 2001, pp. 1-10.

Amidi, et al., Vision-Based Autonomous Helicopter Research at Carnegie Mellon Robotics Institute, School of Computer Science, pp. 1-15.

Luque-Vega et al., Power Line Inspection Via an Unmanned Aerial System Based on the Quadrotor Helicopter, Power Line Inspection Via an Unmanned Aerial System Based on the Quadrotor Helicopter.

Katrasnik, et al., New Robot for Power Line Inspection, Robotics, Automation and Mechatronics, 2008 IEEE Conference, 2008.

Ham, et al., Visual Monitoring of Civil Infrastructure Systems Via Camera-Equipped Unmanned Aerial Vehicles (Uavs): A Review of Related Works, Visualization in Engineering 4:1 (2016), pp. 1-8.

* cited by examiner

FIG. 4

| AOI ID 408 | LOCATION 410 | SIZE 412 | TERRAIN TYPE 414 | ELEVATION 416 | FEATURES 418 | HISTORICAL WEATHER 420 |
|---|---|---|---|---|---|---|
| AOI_1 422 | LOC_A 424 | SIZE_A 426 | TER_A 428 | ELV_A 430 | FTRS_A 432 | HWTHR_A 434 |
| AOI_2 | LOC_B | SIZE_A | TER_B | ELV_B | FTRS_B | HWTHR_B |
| ... | ... | ... | ... | ... | ... | ... |
| AOI_N | LOC_N | SIZE_N | TER_N | ELV_N | FTRS_N | HWTHR_N |

| DEVICE ID 508 | DEVICE TYPE 510 | SENSOR/FEATURES 512 | POWER SOURCES 514 | COMM 516 | PROTECTION 518 | MOBILITY 520 | OP FEATURES 522 | OP TIME 524 | OP COSTS 526 |
|---|---|---|---|---|---|---|---|---|---|
| DEV_1 528 | TYPE_A 530 | FTRS_A 532 | PWR_A 534 | COM_A 536 | PROT_A 538 | MOB_A 540 | OP_A 542 | TM_A 544 | CST_A 546 |
| DEV_2 | TYPE_B | FTRS_B | PWR_B | COM_B | PROT_B | MOB_B | OP_B | TM_B | CST_B |
| ... | ... | ... | ... | ... | ... | ... | ... | ... | ... |
| DEV_N | TYPE_N | FTRS_N | PWR_N | COM_N | PROT_N | MOB_N | OP_N | TM_N | CST_N |

500 / 502 / 504 / 506

| COMPONENT ID | COMPONENT TYPE | AOI | PART NUMBER | LOCATION | FUNCTION | ... |
|---|---|---|---|---|---|---|
| CID_1 *620* | TYPE_A *622* | AOI_1 *624* | PRT_A *626* | LOC_1 *628* | FNC_A *630* | ... |
| CID_2 | TYPE_B | AOI_A | PRT_B | LOC_2 | FNC_B | ... |
| ... | | ... | ... | ... | ... | ... |
| CID_N | TYPE_N | AOI_Y | PRT_N | LOC_N | FNC_N | ... |

FIG. 6

| INSPECTION PATH ID 810 | DEVICE ID 812 | COORDINATE DATA 814 | ALTITUDE DATA 816 | SPEED DATA 818 | TEMPORAL DATA 820 | INSPECTION ANGLE(S) 822 | ... |
|---|---|---|---|---|---|---|---|
| IP_1 824 | DEV_A 826 | CRDSET_A 828 | ALTSET_A 830 | SPDSET_A 832 | T_A 834 | ANG_A ANG_B | ... |
| IP_2 | DEV_B | CRDSET_B | ALTSET_B | SPDSET_B | T_B | ANG_C 836 | ... |
| IP_3 | DEV_C | CRDSET_C | ALTSET_C | SPDSET_C | T_C | ANG_D | ... |
| ... | ... | ... | ... | ... | ... | | ... |
| IP_N | DEV_N | CRDSET_N | ALTSET_N | SPDSET_N | T_N | ANG_N ANG_X | ... |

| COMPONENT ID | AOI | LOCATION | OP STATE | DAMAGE TYPE(S) | DAMAGED PART(S) | TIME | WEATHER | ... |
|---|---|---|---|---|---|---|---|---|
| CID_1 924 | AOI_1 926 | LOC_1 928 | OP 930 | N/A 932 | N/A 934 | T_A 936 | WTHR_A 938 | ... |
| CID_2 | AOI_A | LOC_2 | NON_OP | DMG_A | PART_A | T_B | WTHR_B | ... |
| ... | ... | ... | ... | ... | ... | ... | ... | ... |
| CID_N | AOI_Y | LOC_N | OBSTR | DMG_N | PART_N | T_N | WTHR_N | ... |

FIG. 9

| WORK ORDER ID | 00XX | ... |
|---|---|---|
| DATE | DATE_A | ... |
| SYSTEM COMPONENT(S) | CID_2 TRANSFORMER | ... |
| LOCATION | LOC_2 | ... |
| PROBLEM | DAMAGE_A | ... |
| CAUSE | CAUSE_A | ... |
| CREW | CREW_A | ... |
| INSTRUCTIONS | INSTRUCTIONS_A | ... |
| EQUIPMENT | EQUIP_A EQUIP_N | ... |
| PARTS | PARTS_A PARTS_N | ... |
| WEATHER | WEATHER_A | ... |
| ... | ... | ... |

REMOTE AUTONOMOUS INSPECTION OF UTILITY SYSTEM COMPONENTS UTILIZING DRONES AND ROVERS

FIELD OF THE DISCLOSURE

The present invention generally relates to utility systems, and more particularly to monitoring and inspecting utility system components.

BACKGROUND

The North American power grid has been characterized by the Smithsonian Institution as the largest machine ever built by mankind. The size, geographic diversity, environmental diversity, and the multitude of components that comprise the power grid presents unique challenges in the rapid and efficient upgrading the system with diverse new technologies that realize America's objective of improved power grid reliability and hardening. Accordingly, utility systems are an integral part of modern day life. Unfortunately, components of these systems may become inoperable. For example, consider an electrical power substation that is part of a power grid. Substations perform various functions such as transforming voltage, connecting two or more transmissions lines, transferring power, and protecting the grid from short circuits and overload currents. In many instances substation equipment is susceptible to damage, which may result in power outages throughout the grid. Power outages decrease customer satisfaction and damaged substation equipment increases costs incurred by the utility provider.

BRIEF DESCRIPTION OF THE SEVERAL VIEWS OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which:

FIG. 4 shows one example of area of interest data according to one embodiment of the present invention;

FIG. 5 shows one example of monitoring device data according to one embodiment of the present invention;

FIG. 6 shows one example of system component data according to one embodiment of the present invention;

FIG. 8 shows one example of inspection path data according to one embodiment of the present invention;

FIG. 9 shows one example of inspection results data according to one embodiment of the present invention;

FIG. 10 shows one example of an autonomously generated work order according to one embodiment of the present invention;

DETAILED DESCRIPTION

Figure 1:
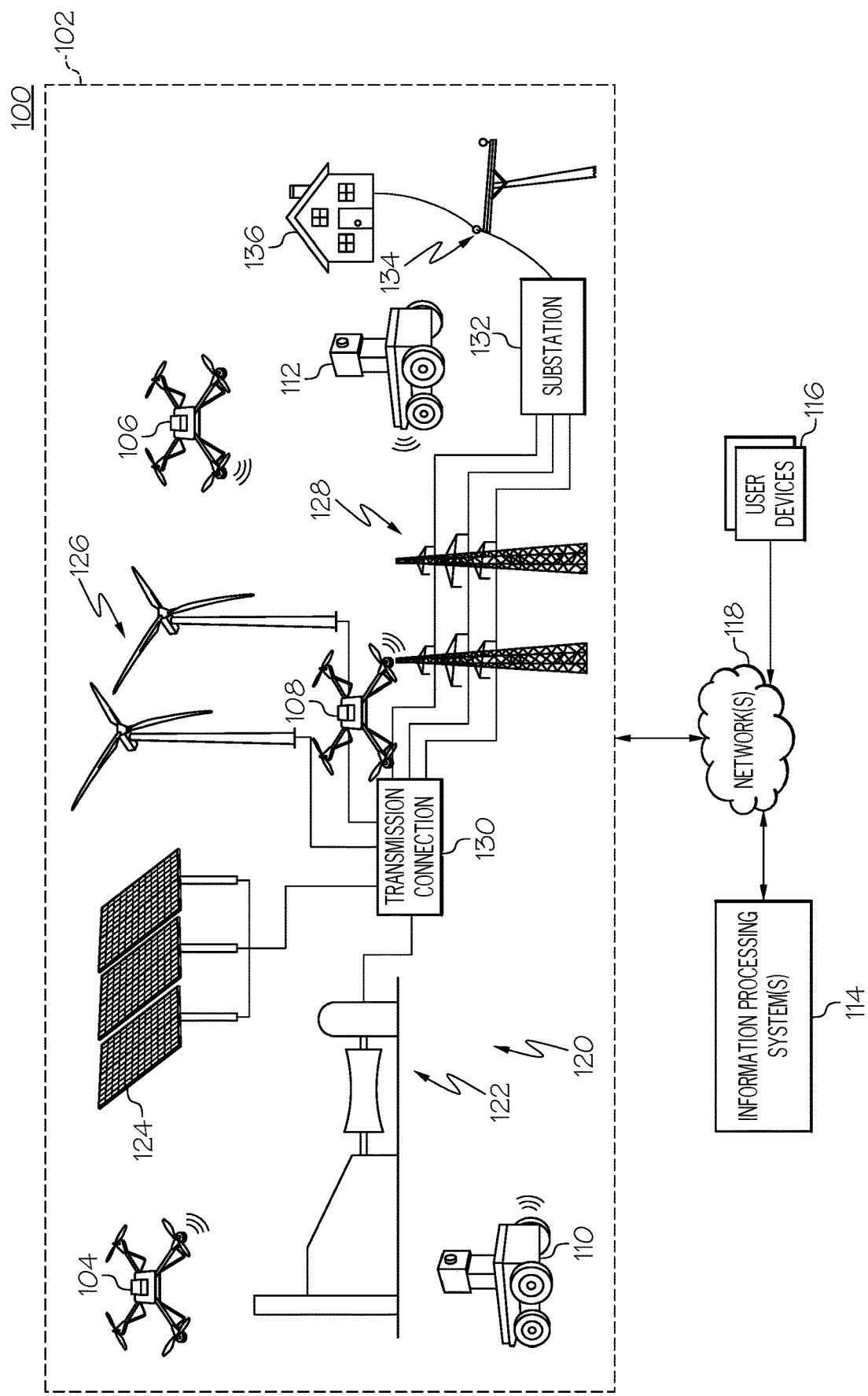
FIG. 1 is an illustrative example of a system for autonomous inspection/monitoring of components within areas of interest according to one embodiment of the present invention.

As required, detailed embodiments are disclosed herein; however, it is to be understood that the disclosed embodiments are merely examples and that the systems and methods described below can be embodied in various forms. Therefore, specific structural and functional details disclosed herein are not to be interpreted as limiting, but merely as a basis for the claims and as a representative basis for teaching one skilled in the art to variously employ the disclosed subject matter in virtually any appropriately detailed structure and function. Further, the terms and phrases used herein are not intended to be limiting, but rather, to provide an understandable description.

The terms "a" or "an", as used herein, are defined as one or more than one. The term plurality, as used herein, is defined as two or more than two. The term another, as used herein, is defined as at least a second or more. The terms "including" and "having", as used herein, are defined as comprising (i.e., open language). The term "coupled", as used herein, is defined as "connected", although not necessarily directly, and not necessarily mechanically. The term "configured to" describes hardware, software or a combination of hardware and software that is adapted to, set up, arranged, built, composed, constructed, designed or that has any combination of these characteristics to carry out a given function. The term "adapted to" describes hardware, software or a combination of hardware and software that is capable of, able to accommodate, to make, or that is suitable to carry out a given function.

The below described systems and methods provide for the remote autonomous inspection of system components within areas of interest (AOIs) utilizing autonomous monitoring devices, and further facilitates the autonomous generation of work orders for rapid deployment of repair crews. In some embodiments, AOIs are geographical areas comprising utility system components. However, embodiments of the present invention are not limited to utility systems. Components of a utility system may wear down, become damaged, or become inoperable. Depending on the geographical location of these components; current weather conditions; types of damage or operational issues; and/or the like it may be difficult to detect, locate, and remedy the issues within an acceptable amount of time. This may result in increased downtime of the system component(s), which decreases customer satisfaction and increases costs incurred by the utility provider.

Conventional utility system inspection/monitoring mechanisms generally involve dispatching work crews to inspect and identify any worn down or damaged component(s), the extent of damage, cause of damage, etc. These conventional mechanisms are problematic because they increase the downtime of the system component, increase outages experienced by the customer, increase expenses incurred by the utility provider, etc. For example, it takes times for a crew to reach a site to assess damage, identify inoperable components, and receive repair components. In addition, the work crew may need to operate in dangerous environmental conditions to identify and repair the problematic components. Also, conventional work orders usually do not provide very detailed information or require users to access multiple menus/pages to drill down to information of interest. This can be problematic when viewing work orders on portable electronic devices such as mobile phones, tablets, etc.

Embodiments of the present invention overcome the above problems by implementing an autonomous system across one or more information processing systems. The system autonomously manages mobile unmanned monitoring devices for obtaining inspection data associated with one or more system components within AOIs, and further for autonomously generating work orders based on the inspection data. As will be discussed in greater detail below, the system programs at least one mobile unmanned monitoring device to autonomously monitor at least one system component within an area of interest. The system communications with the at least one mobile unmanned monitoring device and receives inspection data for the at least one system component that was generated by the at least one mobile unmanned monitoring device. The system utilizes one or more machine learning mechanisms to process the inspection data. Based on this processing, the system determines a current operational state of the at least one system component. Then, the system autonomously generates a work order based on the operational state. The work order comprises a plurality of components addressing the current operational state of the at least one system component. The system autonomously provisions one or more of the plurality of components for the work order.

Embodiments of the present invention allow for system components, such as utility systems components, to be autonomously monitored and inspected for real-time or near real-time detection and identification of problems experienced by the components. In addition, the autonomous system is able to process large amounts of data of different types captured by mobile unmanned monitoring devices, which allows for more efficient and accurate detection of damaged system components when compared to conventional systems. Work orders may be autonomously generated and the required parts, equipment, and work crews identified within the work order may be autonomously provisioned to provide an advantageous improvement in response time when compared to conventional systems. The above allows for system/component down time, customer dissatisfaction, and utility provide expenses to be greatly decreased since work crews do not need to be dispatched to diagnose the problem. In addition, embodiments of the present invention generate an interactive map allowing work crew members to see important work order, system component, and inspection data information on displays of, for example, mobile phones and tablets without having to parse through multiple, windows, menus etc.

FIG. 1 shows one example of an operating environment 100 for remote autonomous inspection of utility system components. In one embodiment, the operating environment 100 may comprise one or more AOIs 102, monitoring devices 104 to 112, information processing systems 114, user devices 116, networks 118, and/or the like. The AOI(s) 102 may be a defined geographical area comprising one or more geographical features and components of a utility system situated at various locations within the AOI 102.

Examples of geographical features includes rivers, streams, hills, cliffs, mountains, trees, boulders, and/or the like. Examples of utility systems include power grid systems (e.g., fossil fuel based, solar-based, wind-based, nuclear-based generation, transmission and/or distribution subsystems), telephone systems (landline and wireless), water systems, gas systems, and oil systems. Each of these different types of utility systems may have multiple types of subsystems. For example, an electric power delivery system generally comprises a generation subsystem, a transmission subsystem, and a distribution subsystem. Each of these of these subsystems performs one or more specific functions and comprise multiple components. For example, the distribution subsystem of an electric power system comprises substations where each substation performs various functions for a power grid such as transforming voltage, connecting transmissions lines, transferring power, and protecting the grid from short circuits and overload currents, and/or the like. Components of a substation include, but are not limited to, incoming and outgoing power lines, transformers, disconnect switches, circuit breakers, arresters, etc. Other non-limiting examples of utility system components include utility poles, transmissions lines, solar panels, cooling towers, pipelines, and/or the like.

In the example shown in FIG. 1, the AOIs 102 includes an electrical power "grid" that is used to provide electrical power to consumer premises 136. Area 102 may contain a multitude of individual or overlapping AOIs. The example shown in FIG. 1 depicts a number of example power generation components 120. Illustrated are a combined cycle gas generator 122, a solar array farm 124, and a wind farm 126 AOIs. In further examples, operational contexts are able to include one power generation component, multiple collocated power generation components, power generation components that are physically separated and supply a common electrical power transmission or distribution system, any one or more power generation components, or combinations of these. These power generation components are able to be of any suitable type or design.

In this example, electrical power generated by one or more power generation components is provided to a power transmission system 128. The illustrated example depicts a transmission connection 130 that couples one or more sources within power generation components 120 to the power transmission system 128. The transmission connection 130 and power transmission system 128 AOIs in an example include suitable step-up transformers and long-distance transmission lines to convey the generated electrical power to remote power distribution networks, other electrical power consumers, or both.

The illustrated power transmission system 128 provides electrical power to one or more distribution systems including a substation 132, distribution lines 134 and premises 136. The substation 132 AOI may include transformers, protection devices, and other components to provide electrical power to a power distribution lines 134. The power distribution lines 134 delivers power produced by the generating components 124 to customer premises, such as the illustrated home 136. In general customer premises are coupled to the power distribution system 138 and are able to include any combination of residential, commercial or industrial buildings. FIG. 1 further shows the one or more monitoring/inspection devices 104 to 112 placed at one or more locations within the AOIs 102. As will be discussed in greater detail below, the monitoring devices 104 to 112 are configured to remotely and autonomously inspect utility system components.

The monitoring devices 104 to 112, in one embodiment, may be unmanned mobile monitoring devices such as (but are not limited to) unmanned aerial vehicles (UAVs), drones, rovers, climbing robots, and/or the like having monitoring systems such as optical cameras, infrared sensors, LIDAR, RADAR, acoustic systems, and/or the like. In other embodiments, one or more of the monitoring devices 104 to 112 may be a fixed device such as a camera. As will be discussed in greater detail below the monitoring devices 104 to 112 may autonomously monitor and inspect system components within an AOI 102.

Figure 2:
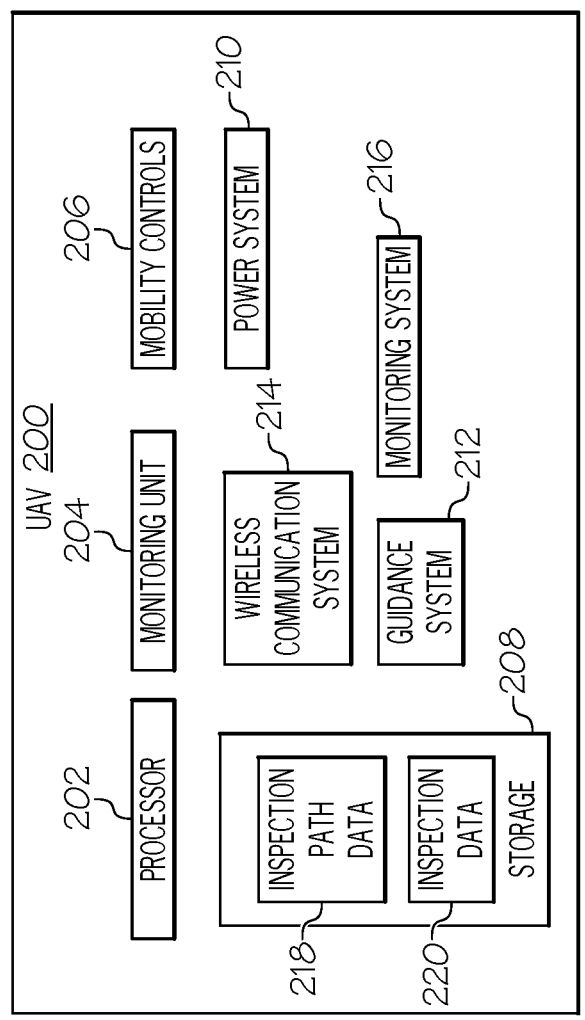
FIG. 2 is a block diagram illustrating one example of a mobile unmanned monitoring device according to one embodiment of the present invention.

FIG. 2 shows one non-limiting example of a monitoring device 200 corresponding to the monitoring devices 104 to 112 of FIG. 1. In this example, the monitoring device 200 comprises one or more processors 202, a monitoring unit 204, mobility controls 206, one or more storage units 208, one or more power systems 210, one or more guidance systems 212, one or more wireless communication systems 214, and a monitoring system 216. The processor(s) 202 may perform various computing functions for the monitoring device 200. The monitoring unit 204 may control automated mobility (e.g., flying, roving, climbing, etc.) operations of the device 200; receive data from the information processing system 114 such inspection path data and instructions indicating that the monitoring device 200 is to initiate mobility operations; manages monitoring/inspection operations to be performed by the device 200 for one or more system components of the AOI 102; and/or the like.

In one embodiment, the monitoring unit 204 utilizes the monitoring system 216 and computer/machine learning mechanisms to autonomously identify system components; determine a current operational state of the system components; determine any problems with and/or damage to the components; and/or the like. The monitoring unit 204 may also control automated mobility operations of the device 200. For example, if the device 200 is a UAV the monitoring unit 204 (and/or processor 202) may autonomously control the various systems and mobility controls/components that enable the monitoring device 200 to traverse an inspection path. The monitoring unit 204 may be part of the processor 202, is the processor 202, or is a separate processor. The monitoring unit 204 is discussed in greater detail below.

The mobility controls 206 comprise various mechanisms and components such as propellers, tracks, motors, gyroscopes, accelerometers, and/or the like that enable the monitoring device 200 to take flight, rove, climb, and/or the like. The mobility controls 206 are autonomously managed and controlled by the monitoring unit 204 and/or processor 202. The storage unit(s) 208 includes random-access memory, cache, solid state drives, hard drives, and/or the like. In one embodiment, the storage unit(s) 208 comprises inspection path data 218, inspection data 220, and/or the like. The inspection path data 218, in some embodiments, is received by the monitoring unit 204 from the information processing system 114 and/or is autonomously generated by the monitoring unit 204. The inspection path data 218 includes, for example, predefined and/or autonomously generated coordinates that form a path be traversed by the monitoring device 200 for inspecting/monitoring one or more system components within an AOI 102. The inspection path data 218 includes may also include altitude data and speed data that indicate the altitude and speed at which the monitoring device 200 is to traverse one or more portions of the inspection path. The inspection path data 218 may further include data indicating specific angles at which the monitoring device 200 is to position itself relative to a given system component for capturing inspection data 220.

The inspection path data 218 may be stored at the monitoring device 200 and/or at the information processing system 114. In this embodiment, the monitoring unit 204 of the device 200 may receive an instruction from the information processing system 114 indicating that the device 200 is to initiate mobility operations (e.g., initiate flight, roving, climbing, etc.) along with the identifier of the inspection path to be taken. The monitoring unit 204 may analyze the inspection path data 218 to identify the inspection path corresponding to the received identifier. In another embodiment, the monitoring unit 204 autonomously determines which inspection path data 218 to follow based on parameters such as day, time, expected weather, and/or the like.

The power system(s) 210 provides power to the monitoring device 200 and its components. The power system(s) 210 may include batteries, photovoltaic components, fuel, and/or the like. The guidance system 212, in one embodiment, comprises components such as a Global Positioning System (GPS) tracking system, accelerometers, gyroscopes, magnetometers, collision avoidance components (e.g., LIDAR, RADAR, etc.), and/or the like. The GPS tracking system may be utilized to plot trajectories of the device 200 and determine the location, speed, heading, and altitude of the device 200. The accelerometer(s) may also be utilized to determine the speed of the device, while the magnetometer(s) may be utilized to determine the device's heading. The gyroscope enables the device 200 to correct its orientation with respect to the ground. The GPS tracking system may utilize one or more of the location, speed, heading, and altitude data to adjust the course of the device 200. The collision avoidance components enable the device to detect obstacles in its path and adjust its location, speed, heading, and/or altitude accordingly.

The wireless communication system 214 comprises components such as Wi-Fi based transmitters/receivers, cellular-based transmitter/receivers, etc. that enable the device 200 to send and receive secured and/or unsecured wireless communications. The wireless communication system 214 may also include wired network components that may be utilized to transmit data while the device 200 is docked at a docking station, recharging station, and/or the like. The monitoring system 216, in one embodiment, comprises one or more optical cameras, infrared sensors, LIDAR, RADAR, acoustic systems, and/or the like that capture their respective data types associated with system components within an AOI 102. The captured data is stored as inspection data 220.

Figure 3:
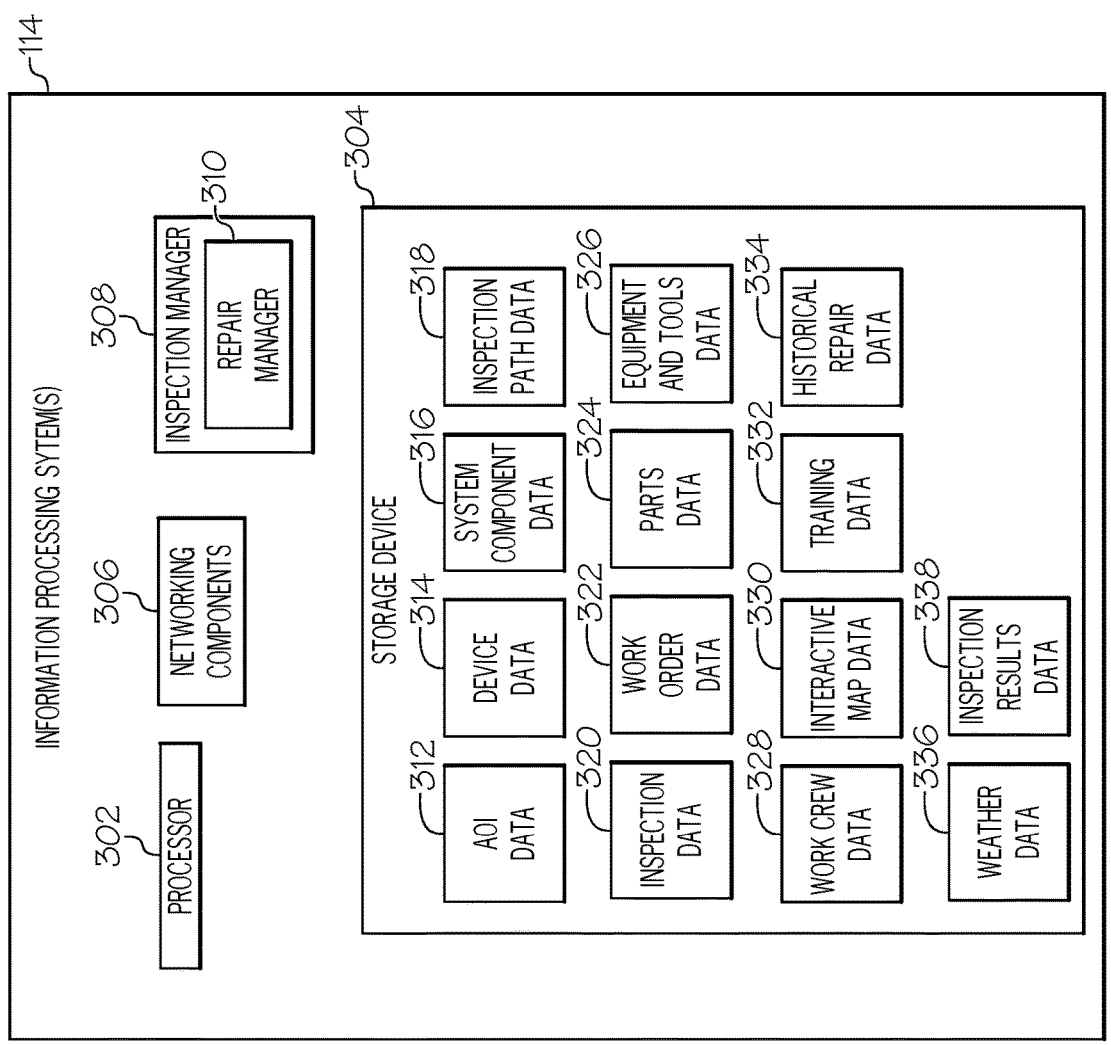
FIG. 3 is a block diagram illustrating one example of an information processing system for managing autonomous inspection/monitoring of components within areas of interest according to one embodiment of the present invention.

FIG. 3 shows one non-limiting example of the information processing system 114. The information processing system 114 may include one or more processors 302; one or more storage devices 304; networking/communication components 306; and an inspection manager 308 comprising a repair manager 310. In one embodiment, the storage device(s) 304 may store various types of data such as AOI data 312, monitoring device data 314, utility system component data 316, inspection path data 318, inspection data 320, work order data 322, parts data 324, equipment and tool data 326, work crew data 328, interactive map data 330, training data 332, repair data 334, weather data 336, inspection results data 338 and/or the like. It should be noted that although FIG. 3 shows the various types of data 312 to 336 residing within the storage device(s) 304, one or more of these datasets may reside outside of the storage device(s) 304 on one or more remote information processing systems. It should also be noted that one or more of the information processing system components may be distributed across multiple information processing systems. The components of the information processing system 114 are discussed in greater detail below. In some embodiments, the inspection manager 308 performs one or more operations performed by the monitoring unit 204 of the monitoring devices 104 to 112, and vice versa.

In one embodiment, the inspection manager 308 may program the monitoring devices 104 to 112 with one or more inspection paths for performing inspection operations with respect to system components within the AOI 102. In other embodiments, the monitoring unit 204 may program the monitoring device 104 with one or more inspection paths. The inspection paths may be predefined and/or autonomously generated by the inspection manager 308. The inspection paths are stored within the storage device(s) 304 of the information processing system 114 as inspection path data 318. In an embodiment where the inspection manager 308 autonomously generates the inspection paths, the inspection manager 308 analyzes the AOI data 312, monitoring device data 314, and utility system component data 316 to determine a given inspection path for a given monitoring device 104 to perform inspection operations for one or more system component(s).

AOI data 312 comprises data such as (but not limited to) the geographical type of the AOI, geographical features within the AOI, geographical size or boundaries of the AOI, elevation of the AOI, historical weather of the AOI, local and/or migratory wildlife data for the AOI, and/or the like. The inspection manager 308 may obtain AOI data 312 for a given AOI 102 in different ways. For example, the inspection manager 308 may utilize one or more of the networking components 306 to establish a communication link with a remote information processing system(s) (not shown) via the network 118, where the communication link may be secure or unsecure. In this example, the remote information processing system stores AOI data for one or more utility systems. Upon establishing the communication link, the inspection manager 308 may download the AOI data 312 stored at the remote information processing system and store this data as local AOI data 312 in the one or more storage devices 304. In other embodiments, the inspection manager 308 does not download the remotely stored AOI data, but accesses and processes this data directly on the remote information processing system. Alternatively, the remote information processing system may push its AOI data to the inspection manager 308 at one or more predefined intervals and/or upon new AOI data being obtained by the remote information processing system.

In some embodiments, the AOI data 312 obtained from the remote information processing system comprises data for all AOIs associated with one or more entities (e.g., utility providers) utilizing the inspection manager 308. In other embodiments, the inspection manager 308 obtains the remote AOI data on an as needed basis. For example, when the inspection manager 308 determines an AOI 102 requires inspection operations the inspection manager 308 only obtains AOI data for the specific AOI 102 (and possibly related AOIs as well).

FIG. 4 shows various examples of AOI data 312. In the example shown in FIG. 4, each row 402, 404, 406 in the table 500 corresponds to AOI data for a given AOI and is referred to herein as an "AOI profile". In this example, each column within the table 400 stores a different type of data. It should be noted that embodiments of the present invention are not limited to the types of data shown in the columns of FIG. 4. Also, one or more of the columns shown in FIG. 4 may be removed and/or additional columns having different types of data may be added. It should also be noted that AOI profiles for different AOIs are not required to be stored in a single table and may be stored separate from each other.

In the example shown in FIG. 4 the table 400 comprises a first column 408 entitled "AOI ID"; a second column 410 entitled "Location"; a third column 412 entitled "Size"; a fourth column 414 entitled "Terrain Type"; a fifth column 416 entitled "Elevation"; a sixth column 418 entitled "Features"; and a seventh column 420 entitled "Historical Weather". The "AOI ID" column 408 comprises entries 422 such as a unique identifier that uniquely identifying each AOI and its profile in the table 400. The "Location" column 410 comprises entries 424 with data identifying the location of the AOI associated with the AOI profile. One example of location data includes a range of longitude and latitude coordinates defining the area encompassed by the AOI. The "Size" 412 column comprises entries 426 indicating the geographical size of the AOI. The "Terrain Type" column 414 comprises entries 428 indicating the type of terrain associated with AOI. For example, the entries may indicate the terrain type as "Hill", "Desert", "Mountain", "Open", etc. The "Elevation" column 416 comprises entries 430 indicating the elevation of the AOI.

The "Features" column 418 comprises entries 432 identifying geographical features and (optionally) their locations within the AOI. For example, a feature entry under this column may indicate the AOI has a river/stream, mountain, cluster of trees, boulders, and/or the like at specific locations within the AOI. In another example, a feature entry may indicate that the ground within the AOI is comprised of gravel, grass, cement, and/or the like. The "Historical Weather" column 420 comprises entries 434 having historical weather data such as weather patterns for the AOI. For example, the entries under this column may indicate the daily, weekly, monthly, and/or yearly average temperatures, humidity levels, wind speeds, rainfall, snowfall, UV levels, and/or the like.

Monitoring device data 314 for a given monitoring device comprises data such as (but not limited to) device type, sensor data, power source(s), communication capabilities, environmental protection, mobility capabilities, operational range/time(s), and/or the like. The inspection manager 308 may obtain monitoring device data for a given AOI similar to the methods discussed above with respect to the AOI data 312. FIG. 5 shows various examples of monitoring device data 314. In the example shown in FIG. 5, each row 502, 504, 506 in the table 500 corresponds to monitoring device data for a given set of monitoring devices; an individual monitoring device; and/or monitoring device accessories such as refueling/recharging docking systems and weather protection enclosures. Each row 502, 504, 506 may be referred to herein as an "monitoring device profile". In this example, each column within the table 500 stores a different type of data. It should be noted that embodiments of the present invention are not limited to the types of data shown in the columns of FIG. 5. Also, one or more of the columns shown in FIG. 5 may be removed and/or additional columns having different types of data may be added. It should also be noted that monitoring device profiles for different monitoring devices are not required to be stored in a single table and may be stored separate from each other.

In the example shown in FIG. 5 the table 500 comprises a first column 508 entitled "Device ID"; a second column 510 entitled "Device Type"; a third column 512 entitled "Sensor/Feature Data"; a fourth column 514 entitled "Power Source(s)"; a fifth column 516 entitled "Comm"; a sixth column 518 entitled "Protection"; a seventh column 520 entitled "Mobility"; an eighth column 522 entitled "Op Features"; a ninth column 524 entitled "Op Time"; and a tenth column 526 entitled "Op Costs". The "Device ID" column 508 comprises entries 528 comprise a unique identifier for the device associated with the monitoring device profile. It should be noted that in some embodiments, each row in the table is a monitoring device profile for a group of identical devices such as a given product. For example, a monitoring device profile may represent a given product such as a specific UAV model. In this embodiment, the identifier uniquely identifies the product as a whole. In other embodiments, a monitoring device profile represents an individual device where multiple identical device each of their own monitoring device profile. In this embodiment, the identifier uniquely identifies the individual device.

The "Device Type" column 510 comprises entries 530 indicating the device type of the monitoring device(s) associated with the device profile. Examples of device types include (but are not limited to) UAV, rover, climbing robot, camera, and/or the like. The "Sensor/Feature Data" column 512 comprises entries 532 identifying and/or describing the sensors/features that are implemented on the monitoring device(s). For example, these entries may indicate whether the device(s) has a GPS system; accelerometer; a barometer; a weather sensor; an optical imaging system for capturing photographs and/or video; the type of image sensor utilized by the system (e.g., visible light sensor, infrared sensor, etc.); the resolution of the system; focal length of lens; zoom capabilities; and/or the like. The sensor data entries may also indicate if the device has a thermal sensor; ion sensor; plasma sensor; audio sensor; and/or the like, and further identify the operating capabilities of these sensors.

The "Power Source(s)" column 514 comprises entries 534 identifying the types of power sources utilized by the device and their operating characteristics. For example, a power source entry may indicate that the monitoring device comprises a rechargeable or disposable (non-chargeable) battery; number of batteries; whether a rechargeable may be charged using solar or non-solar mechanisms; battery chemistry; battery voltage; battery capacity; battery power; and/or the like. The "Communication" column 516 comprises entries 536 identifying the communication capabilities of the device. For example, a communication entry may indicate whether the device has wired and/or wireless communication abilities; the communication standards/networks supported by the device; security protocols implemented by the device; and/or the like.

The "Protection" column 518 comprises entries 538 indicating the type of environmental protection that is utilized by the device. For example, these entries may indicate the International Protection (IP) Marking code of the device; degree of protection against electromagnetic pulses; degree of protection against drops, bumps, and falls; and/or the like. The "Mobility" column 520 comprises entries 540 indicating the mobility capabilities of the device. For example, a mobility entry may indicate whether the device is fixed or mobile; identify a mobility modality such as flight, ground traversal, climbing, and/or the like; if the device is a camera whether it can be panned and/or tilted; and/or the like.

The "Operating Features" column 522 comprises entries 542 indicating specific features of the device. For example, an operating feature entry may identify the roving, flight, or climbing speed of the device; the number of wheels or propellers; the altitude limit of the device; whether the device has a return to base feature when batter levels are low; and/or the like. The "Op Time/Range" column 524 comprises entries 544 indicating the operating time and/or range of each device of the device before recharging or refueling is needed. The "Op Costs" column 526 comprises entries 546 indicating the costs associated with operating the device. For example, these entries may indicate the purchase cost of the device; prices for replacement parts; average cost to operate the device on a daily, monthly, and/or yearly basis; and/or the like. The average operating cost may take into consideration factors such as expected repairs or parts replacement, fuel or electricity costs, and/or the like.

System component data 316 comprises data such as (but not limited to) a unique identifier of the component; part number of the component; location of the component; function of the component; configuration data; and/or the like. The inspection manager 308 may obtain system component data 316 for a given AOI 102 utilizing methods similar to those discussed above with respect to the AOI data 312.

FIG. 6 shows various examples of system component data 316. In the example shown in FIG. 6, each row 602, 604, 606 in the table 600 corresponds to system component data for system components located within AOIs, and is referred to herein as an "system component profile". In this example, each column within the table 600 stores a different type of data. It should be noted that embodiments of the present invention are not limited to the types of data shown in the columns of FIG. 6, and one or more columns shown in FIG. 6 may be removed and/or additional columns having different types of data may be added. It should also be noted that system component profiles for different system components are not required to be stored in a single table and may be stored separate from each other. In some embodiments, the system component data 316 may be part of the AOI data 312.

In the example shown in FIG. 6 the table 600 comprises a first column 608 entitled "Component ID"; a second column 610 entitled "Component Type"; a third column 310 entitled "AOI"; a third column 614 entitled "Part Number"; a fourth column 616 entitled "Location"; and a fifth column 618 entitled "Function". The "Component ID" column 608 comprises entries 620 that include a unique identifier for the component associated with the system component profile. The identifier may be a serial number or any other identifier that uniquely identifies the system component. The "Component Type" column 610 comprises entries 622 indicating the type of system component (e.g., transformer, solar panel, wind turbine, etc.) associated profile. The "AOI" column 612 comprises entries 624 with data identifying the AOI where the given system component location resides. The AOI entries may comprise a pointer to the corresponding AOI profile within the AOI data 210 and/or a unique identifier of the AOI. In some embodiments, an AOI profile for a given AOI may comprise an entry having the unique identifiers of the system components residing within the AOI and/or pointers to the corresponding system component profiles.

The "Part Number" column 614 comprises entries 626 indicating the part number/model of the system component. The "Location" column 616 comprises entries 628 identifying the location of the system component within the AOI. For example, location entries may comprise latitude/longitude coordinates of the component; altitude data; and/or the like. The "Function" column 618 comprises entries 630 identifying/describing the functions and features of the component.

When the inspection manager 308 determines a monitoring device 104 requires inspection path data 318, the inspection manager 308 utilizes one or more of the AOI data 312, monitoring device data 314, and utility system component data 316 to determine a given inspection path for a given monitoring device 104. The inspection manager 308 may determine that a monitoring device 104 requires inspection path data 318 based on a communication received from the monitoring device 104; a communication received from a remote information processing system; a determination made by the inspection manager 308 that the monitoring device 104 is not currently associated with an inspection path or its current path needs to be updated; obstructions/debris identified within a current inspection path of the device; and/or the like. In some embodiments, the inspection manager 308 may identify obstructions/debris based on processing inspection data received from the monitoring device 104 (and/or a different monitoring device); receiving a communication from the monitoring device 104 (and/or a different monitoring device) based on the monitoring device(s) 104 processing its inspection data and determining that an obstruction/debris is it its inspection path; and/or the like.

The inspection manager 308 may analyze the AOI data 312, the monitoring device data, and/or the utility system component data 316 to determine information such as the AOI in which the device 104 is located; geographical features of the AOI; the location within the AOI 102 at which the device 104 is located; the device's operational capabilities (e.g., range, battery life, mobility capabilities, inspection capabilities, etc.); the system components within the AOI 102; the location of the components within the AOI; system component configuration; and/or the like. The inspection manager 308 analyzes the obtained data and autonomously generates one or more inspection paths for the monitoring device 104 and stores the path as inspection path data 318.

For example, the inspection manager 308 may determine that the inspection/monitoring device 104 is a UAV located at position P_1 and is to monitor system component located at P_N at and having a height of H_1. The inspection manager 308 may further determine that monitoring device 104 has flight capabilities, a battery capacity of C and an operational range of R. The inspection manager 308 also determines that the AOI comprises a cluster of trees near the system component at position P_2. Taking this data into consideration, the inspection manager 308 autonomously generates one or more flight paths for the monitoring device such that the device avoids the cluster of trees and is able to perform one or more inspection operations with respect to the system component while being able to return to its home base (or at least a recharging station) prior to depleting its power/energy source(s). The inspection manager 308 may utilize one or more machine learning mechanisms for generating an inspection path. A discussion on machine learning mechanisms is provided in greater detail below. In some embodiments, the monitoring unit 208 may perform the operations discussed herein with respect to selecting and/or autonomously generating an inspection path for its monitoring device 104 to traverse.

Figure 7:
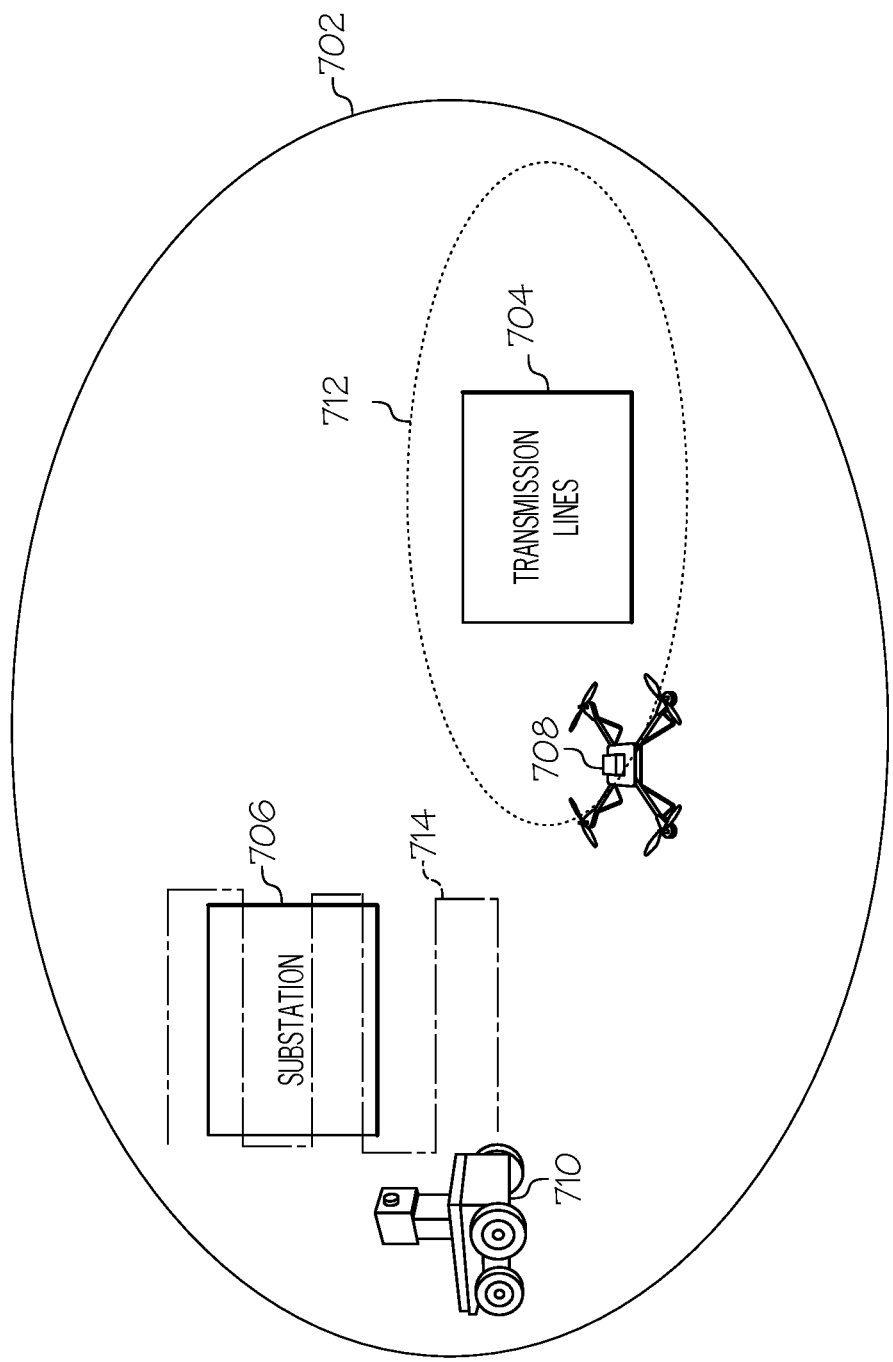
FIG. 7 shows one example of inspection paths assigned to different types of mobile unmanned monitoring devices according to one embodiment of the present invention.

FIG. 7 shows one example of inspections paths defined for monitoring devices. In this example, an AOI 702 comprises transmissions lines 704 and substation components 706. A first monitoring device 708 has been selected to monitor the transmission lines 704 and a second monitoring device 710 has been selected to monitor the substation components 706. The first monitoring device 707 has been assigned a first inspection path 712, while the second monitoring device 710 has been assigned a second inspection 714. It should be noted that a single monitoring device may be assigned multiple inspection paths. As will be discussed in greater detail below, the monitoring devices 708, 710 traverse their inspection paths 712, 714 to perform one or more inspection operations with respect to the system components 704, 706.

In some embodiments, there may be multiple monitoring devices 104 to 112 located within a given AOI 102. In these embodiments the AOI data 312, the monitoring device data, and/or the utility system component data 316 may indicate which device(s) is to monitor a given system component(s). The inspection manager 308 may also determine which device is to monitor a given system component based on its distance from the system component, the device's operational capabilities, geographical features of the AOI 102, configuration of the system component; and/or the like.

For example, the AOI of FIG. 7 comprises a first monitoring device 708 and a second monitoring device 710. Based on the monitoring device data 314, the inspection manager 308 determines that the first monitoring device 708 is a UAV and the second monitoring device 710 is a rover. The monitoring device also determines that the AOI 102 comprises transmissions lines 704 and substation components 706 based on the AOI data 312 and/or the system component data 316. Based on, for example, the operational capabilities of each monitoring device 708, 710 identified within the device data 314 the inspection manager 308 selects the first monitoring device 708 to inspect the transmission lines 704 and the second monitoring device 710 to inspect the substation components 706. It should be noted that, in some embodiments, the monitoring unit 204 of a monitoring device 104 may perform the operations discussed above with respect to the inspection paths.

Once the inspection manager 308 has selected and/or generated an inspection path for a given monitoring device 104, the inspection manager 308 stores the path as inspection path data 318. FIG. 8 shows various examples of inspection path data represented as a table 800. In the example shown in FIG. 8, each row 802 to 808 in the table 800 corresponds to an inspection path. It should be noted that in other embodiments, each inspection path 802 to 808 is stored separate from one another. The table 800 comprises a plurality of columns, each storing a different set of information. In this example, the table 800 comprises a first column 810 entitled "Inspection Path ID"; a second column 812 entitled "Device ID"; a third column 814 entitled "Coordinate Data"; a fourth column 816 entitled "Altitude Data"; a fifth column 818 entitled "Speed Data"; a sixth column 820 entitled "Temporal Data"; and a seventh column 822 entitled "Inspection Angle(s)". It should be noted that the inspection path data 318 is not limited to the items shown in FIG. 8 as one or columns may be removed or additional columns added.

The "Inspection Path ID" column 810 comprises entries 824 uniquely identifying each inspection path in the inspection path data. The "Device ID" column 812 comprises entries 826 identifying the monitoring device 104 associated with the inspection path. The entries 826 may include the unique ID associated with the monitoring device; a pointer to the monitoring device profile associated with the device; and/or the like.

The "Coordinate Data" column 814 comprises entries 828 with coordinate data, which may be in three-dimensional space, defining a path and pattern to be traversed. Two or more of the inspection paths may have different traversal patterns or all inspection paths may have the same traversal pattern. In one embodiment, the coordinates of an inspection path are defined such that the monitoring device avoids colliding with any of the system components and other monitoring devices. In addition, two or more inspection paths may have coordinates that overlap with each other.

The "Altitude Data" column 816 comprises entries 830 having altitude data for the corresponding inspection path. For example, the altitude data may define a given altitude a monitoring device 104 is to fly at while traversing the corresponding inspection path. In some embodiments, the altitude data may include different altitudes for different portions of the inspection path. The different altitudes may be time-based and/or coordinate-based. The "Speed Data" column 818 comprises entries 832 having speed data for the corresponding inspection path. For example, the speed data may define a given speed the monitoring device 104 is to fly, rove, climb, and/or the like while traversing the inspection path. In some embodiments, the speed data may include different speeds for different portions of the inspection path. The different speeds may be time-based, altitude-based, and/or coordinate-based. The inspection path data 318 may also comprise additional information such as the time/day the monitoring device is to initiate traversal of an inspection path, time/day the monitoring device is to utilize the inspection path. For example, a monitoring device may be assigned different inspection paths based for different periods of time, expected weather patterns, and/or the like.

The "Temporal Data" column 820 comprises entries 834 indicating at when the device is to traverse the flight path. For example, these entries may identify one or more days, one or more times, and/or the like that the device is to traverse the associated flight path. The "Inspection Angle(s)" column 822 comprises entries 836 indicating one or more angles at which a monitoring device 104 is to position itself relative to a given system component for capturing inspection data 220. It should be noted that the inspection path data may be dynamically updated by the inspection manager 308 and/or monitoring unit 204 as the monitoring device 104 is traversing the path. The inspection path data may also be updated while the monitoring device 104 is docked at a docking station or a refueling/recharging station.

In one embodiment, the inspection manager 308 establishes a communication link with the monitoring device 104 and transmits the inspection path(s) to the device 104. The monitoring device 104 stores the inspection path within a storage unit 208 as inspection path data 218. When the monitoring unit 204 of the monitoring device 104 determines that inspection operations are to be performed, the monitoring unit 204 initiates traversal of one or more inspection paths based on the inspection path data 218. For example, the monitoring unit 204 may receive a signal from the information processing system 114 instructing the monitoring unit 204 to perform the inspection operations. In another example, the monitoring unit 204 may have previously received data from the information processing system 114 identifying the day and times the monitoring device 104 is to perform inspection operations with respect to system components. This data may be transmitted by the information processing system 114 as part of inspection path data, separate from the inspection path data, and/or the like.

In another embodiment, the monitoring unit 204 may dynamically determine when an inspection should be performed. For example, the monitoring unit 204 may utilize one or more sensors within the monitoring system 216 or receive weather data 336 from the information processing system (or another system) to determine that inclement weather is approaching, is occurring, and/or has occurred. Upon a determination that inclement weather is approaching or is expected, the monitoring unit 204 may autonomously operate the device 104 to perform an inspection to establish an operational state of the system component prior to the inclement weather. When the monitoring unit 204 determines the inclement weather has passed, the monitoring unit 204 may autonomously operate the device 104 to perform an inspection of the system component. The inspection data captured prior to the inclement weather may be compared against the inspection data captured after the inclement weather to determine any changes in the operational state of the system component. In some embodiments, the inspection manager 308 may perform the above operations as well.

In some instances, the monitoring device 104 may not be scheduled to perform an inspection for a period of time greater than a given threshold after inclement weather has occurred. In this situation, when the monitoring unit 204 determines that a weather event has occurred the monitoring unit 204 dynamically adjusts its inspection schedule to perform an inspection earlier than its schedule indicated. For example, the monitoring device 104 may autonomously operate the monitoring device 104 as soon as it detects the weather even has passed. This allows for any problems with system components to be identified and resolved as soon as possible. It should be noted that the inspection manager 308 may also perform the above operations as well.

As the monitoring device 104 traverses an inspection path(s), the device 104 performs inspection operations with respect to one or more system components within an AOI. The monitoring device 104 utilizes its monitoring system 216 to perform the inspection operations. As discussed above, the monitoring system 216 comprises one or more optical cameras, infrared sensors, LIDAR, RADAR, acoustic systems, and/or the like that capture their respective data types associated with system components. As the system component(s) comes into range of the monitoring system 216, the monitoring system 216 captures and records inspection data 218 associated with the system component. For example, the monitoring system 216 captures still images/frames or a video of the system component; audio associated with the system component; temperature measurements for the system component; gas level measurements for the system component; and/or the like. The monitoring system 216 may also continuously capture inspection data 218 and not just when the system components come into range of the monitoring system 216.

The monitoring unit 204 may store the captured data locally as inspection data 218 and/or transmit the data to the inspection manager 308 at the information processing system 114. The data may also be transmitted to one or more of the user devices 116. The inspection manager 308 may store the received data as inspection data 320. The inspection data 218 may be transmitted to the monitoring unit 204 and/or the user devices 116 at one or more predefined intervals of time. In addition, the inspection data 218 may be transmitted/streamed to the monitoring unit 204 and/or the user devices 116 in real time. The information processing system 114 and/or the user device 116 may then present the inspection data to a user upon receiving the inspection data; at one or more intervals of time; upon request by a user; and/or the like.

After the inspection manager 308 of the information processing system 114 has received inspection data 320 from a monitoring device(s) 104, the inspection manager 308 processes the data to determine a current operational state of system components, determine whether system components are damaged or non-functioning, and/or the like. It should be noted that, at least in some embodiments, determining an operational state of a system component may encompass multiple operations such as determining if the component is operational; non-operational, operating normally (e.g., within expected parameters/thresholds); operating abnormally (e.g., outside expected parameters/thresholds); determining that the component has been damaged, the type of damage, the parts of the component that have been damaged, the location of the damage, the cause of the damage, etc.; determining that the component is being obstructed by debris, the type of debris, the location of the debris, etc.; and/or the like. It should be noted that the monitoring unit 204 of a monitoring device 104 may also be configured to perform these operations as well.

In one embodiment, the inspection manager 308 utilizes one or more machine-learning mechanisms to determine the operational state of the system component, any damaged associated with the component, and/or the like. For example, the inspection manager 308 may utilize a deep learning artificial neural network (DLANN) model trained to recognize system components, determine damage to the system components, determine the type of damage, anticipate damage and/or abnormal operation conditions based on expected weather, and/or the like. It should be noted that other machine learning models and algorithms are applicable as well.

A DLANN model is generally comprised of a plurality of connected units referred to as artificial neurons. Each unit is able to transmit a signal to another unit via a connection there between. A unit that receives a signal from another unit processes the signal and may transmit its own signal to another unit based on the processed signal. A unit may be associated with a state (e.g., $0 \leq x \leq 1$) where both a unit and a connection may be associated with a weight that affects the strength of the signal transmitted to another unit. The weight may vary during the learning process of the model. The model may comprise multiple layers of connected units, where different layers perform different transformations on their inputs. The first layer acts as the initial input (e.g., from the inputted data) to the model, where signals from this layer propagate to the final layer (e.g., identified solution). The initial layers of the model may detect specific characteristics of the target solution while inner layers may detect more abstract characteristics based on the output of the initial layers. The final layers may then perform more a complex detection based on the output inner layers to detect the target solution.

The DLANN model utilized by the inspection manager 308, in one embodiment, is trained by providing training data 332 to the model as an input. The model may be trained at the inspection manager 308 and/or at an external information processing system. In one embodiment, the training data 332 comprises different images of a target object such as a system component, a system component in a normal operating state, a system component in an abnormal operating state (e.g., operating outside of normal parameters/thresholds), one or more damaged portions of a system component, obstructions and/or debris interfering with the system component, and/or the like. In one non-limiting example, an AOI 102 comprises one or more transformers to be monitored/inspected. In this example, the training data 332 comprises different images of a transformer in a normal operating state, a transformer in an abnormal operation state, a transformer with one or more portions being damaged, a transformer with trees or tree limbs interfering with the transformer, and/or the like.

In some embodiments, images comprising the target object(s) (e.g., normal operating transformer, abnormal operating transformer, components of transformer having damage, specific types of debris interfering with transformer components, etc.) to be detected by the inspection manager 308 may be annotated with text and/or a bounding box using specific software. It should be noted that other images of target objects not associated with the environment may be used as training data as well. It should be also noted that embodiments of the present invention are not limited to the environments and/or target objects discussed herein.

In some embodiments, the model comprises a convolution layer where a sliding window is passed over each of the training images where each portion of the training image is saved as a separate image. Each of these separate images for each original training file are then fed into the model as training data. The result of this training step is an array that maps out which parts of the original image have a possible target object or part of a target object. Max pooling can then be used to down sample the array. The reduced array may then be used as input into another artificial neural network and the above processes can be repeated. The final artificial neural network (e.g., fully connected network) determines whether a given image comprises a target object and, if so, which portion(s) of the image comprises the target object. It should be noted that the DLANN model may comprise multiple convolution, max-pooling, and full-connected layers. In addition, the trained DLANN model is able to tolerate shadows, variable image backgrounds, exposure settings, and changing scene lighting, etc. A similar training process may be utilized for other types of data such as audio, sensor readings, and/or the like.

Once the object detection model has been trained, the inspection manager 308 implements the model as an object detector. For example, the inspection manager 308 is programmed to detect one or more specific target objects such as a normal operating solar panel, an abnormal operating solar panel, specific components of the solar panel having damage, specific types of debris interfering with solar panel components, etc. from inspection data 320 (e.g., captured images, audio, sensor data, etc.) captured by the monitoring device 104 to 112 utilizing the object detector.

For example, as a monitoring device 104 is traversing an inspection path its monitoring system 216 captures inspection data 220 such as (images, audio, sensor readings, location/position/time of device at which the data was captured, etc.) of the AOI 102. In some embodiments, the monitoring system 216 continuously captures inspection data 220 while it is operating or traversing an inspection path. In other embodiments, the monitoring system 216 may be programmed with location data (e.g., coordinates) of specific system components to be inspected. In this embodiment, the monitoring unit 204 utilizes the guidance system 212 to determine when the device 104 is within a threshold distance from the location of the system component(s) and activates the monitoring system 216.

The monitoring unit 204 transmits its captured inspection data 220 to the information processing system(s) 114, as discussed above. The inspection manager 308 stores this data as local inspection data 320. It should be noted that inspection data 220 captured by a monitoring device 104 may be stored on a different information processing system(s) and accessed thereon by the inspection manager 308. The inspection manager 308 processes/analyzes the inspection data 320 to determine if the received inspection data comprises a system component such as transmission lines. If the inspection manager 308 determines that the inspection data comprises or corresponds to a system component to be inspected the inspection manager 308 determines a current operational state of the system component based on the inspection data.

For example, if the inspection data 320 comprises images the inspection manager 308 processes these images utilizing its trained object detector to determine if any of the images comprising the system component show the component having any damage or debris. If not, the inspection manager 308 may determine the system component's operational state is normal. However, if the inspection manager 308 determines the system component has been damaged or that debris is interfering with the system component the inspection manager 308 may determine that operational state of the system component is abnormal.

In some instances, the inspection manager 308 may be unable to determine a current operational state of the system component from the inspection data due to the angle at which the monitoring device captured an image. In one embodiment, the inspection manager 308 may communicate with the monitoring device 104 and instruct the device to capture an image from one or more different angles. The inspection manager 308 may provide specific angles to the monitoring device and/or the monitoring unit 204 of the device may determine additional angles at which to capture the data. In another embodiment, the inspection manager 308 may select and instruct one or more different monitoring devices to perform the additional inspection operations. For example, a different monitoring device may be able to provide images from a different angle, provide different types of data, and/or the like.

In some embodiments, the inspection data 320 comprises data in addition to (or in lieu of) images. For example, the inspection data 320 may include audio data, sensor reading data, and/or the like. As discussed above, the object detector of the inspection manager 308 may also be trained utilizing this type of data as well. Therefore, the inspection manager 308 may also utilize this type of data to detect when a system component has been damaged and/or obstructed; the type of damage and/or obstruction; the location and/or part of the system component that has been damaged and/or obstructed; and/or the like based not only on image data but also audio data, sensor reading data and/or the like. The inspection manager 308 may utilize one or more types of data to detect a current operating condition of a system component and may utilize one or more other types of data to perform a more granular analysis of the system component when damage or an abnormal operating condition has been detected.

For example, when damage or an abnormal operating condition has been detected utilizing a first type of inspection data, a second type of inspection data may be utilized to determine the type of damage type, the location of the damage and/or the like. It should be noted that when a first set of inspection data comprising one or more inspection data types is utilized to detect a normal operating condition; abnormal operating condition; damage type and/or the like the inspection manager 308 may utilize a second inspection dataset comprising one or more different inspection data types to confirm these detections/determinations. It should be noted that the monitoring unit 204 of one or more monitoring devices 104 to 112 may perform the operations of the inspection manager 308 discussed above. For example, the monitoring unit 204 may utilize one or more computer learning mechanisms similar to the inspection manager 308 to perform the inspection operations discussed above.

In some embodiments, the inspection manager 308 stores results of processing the inspection data 320 as inspection results data 338. The results may be used to further train the machine learning components of the inspection manager 308. FIG. 9 shows various examples of inspection results data represented as a table 900. In the example shown in FIG. 9, each row 902 to 906 in the table 900 corresponds to an inspection results for a given system component. It should be noted that in other embodiments, each inspection path 902 to 906 is stored separate from one another. It should also be noted that the inspection results data may be stored as part of other data such as system component data 316, inspection data 320, and/or the like. In addition, a given system component may have multiple entries within the table 900. The table 900 comprises a plurality of columns, each storing a different set of information. In this example, the table 900 comprises a first column 908 entitled "Component ID"; a second column 910 entitled "AOI"; a third column 912 entitled "Location"; a fourth column 914 entitled "Op State"; a fifth column 916 entitled "Damage Type"; a sixth column 918; entitled "Damaged Part"; a seventh column 920 entitled "Time"; and an eight column 922 entitled "Weather". It should be noted that the inspection results data 338 is not limited to the items shown in FIG. 9 as one or columns may be removed or additional columns added.

The "Component ID" column 908 comprises entries 924 that include a unique identifier for the component associated with the inspection results data. The identifier may be a serial number or any other identifier that uniquely identifies the system component and/or may be a pointer to the system component profile associated with the system component. The "AOI" column 910 comprises entries 926 with data identifying the AOI where the given system component location resides. The AOI entries may comprise a pointer to the corresponding AOI profile within the AOI data 210 and/or a unique identifier of the AOI. In some embodiments, an AOI profile for a given AOI may comprise an entry having the unique identifiers of the system components residing within the AOI and/or pointers to the corresponding system component profiles.

The "Location" column 912 comprises entries 928 identifying the location of the system component within the AOI. For example, these entries may comprise latitude/longitude coordinates of the component; altitude data; and/or the like. The "Op State" column 914 comprises entries 930 identifying the current operational state of the system component as determined by the inspection manager 316 as a result of processing the inspection data 320. For example, these entries may indicate that the system component is operating normal is operating abnormally, is non-operational, is currently being obstructed by and/or interfered with debris, and/or the like. The "Damage Type" column 916 comprises entries 932 indicating the type of damage (if any) experienced by the system component. For example, these entries may indicate that a transformer has exploded; a transmission line has become decoupled; a solar panel has hail damage; and/or the like. The "Damaged Part" column 918 comprises entries 934 indicating specific part or parts of the system component that has been damaged. The "Time" column 920 comprises entries 936 indicating the time at which the inspection was performed. The "Weather" column 922 comprises entries 938 indicating the weather at the time of inspection. The weather data may be utilized as historical weather data for the inspection manager 308 when predicting potential damage to system components upon determining similar weather is expected in the future.

When the inspection manager 308 detects that a system component is experiencing a problem (e.g., a non-operational state, abnormal operational state, has been damaged, has been obstructed and/or the like) the repair manager 310 autonomously generates a work/repair order for the system component. In one embodiment, a work order may identify the system component to be repaired/replaced; identifies the location of the system component, identifies the problem associated with the system component; identifies the cause of problem; identifies the parts required to repair or replace the system component; identifies the work crew(s) to perform the repair; includes repair/replacement instructions; identifies current and/or expected weather at the location; and/or the like.

In one embodiment, the repair manager 310 may utilize one or more machine/computer learning mechanisms for autonomously generating a work order. Examples of machine/computer learning mechanisms include supervised learning, unsupervised learning, reinforcement learning, and/or the like. In some embodiments, the repair manager 310 implements an artificial neural network (ANN) similar to the discussed above with respect to the inspection manager 308. However, instead of detecting objects within images the repair manager 310 generates work orders based on the inspection results data 338. Work orders generated by the repair manager 310 may be used to further train the machine learning components of the inspection manager 308 and/or the repair manager 310.

The machine/computer learning components of the repair manager 310 may be trained utilizing historical repair data 334, repair manuals for system components, previously generated work orders, and/or the like. The historical repair data 334 may comprise data associated with a plurality of repair/replacement events. Each of these events is associated with a given system component and comprises data such as such as an identification of system component that was previously repaired; the type of damage that was repaired for the component; an identification and description of the parts, tools, and their quantities used to repair the damage; procedures taken to repair the component; time taken to repair the component; the cause of the damage; the weather conditions at the time of damage detection and at the time of repair; work crew identification; work crew details such as identifiers of crew members, crew member qualifications, etc.; and/or the like. In some embodiments, the historical repair data 334 may comprise works order data 322 from work orders previously generated by the repair manager 310 and/or any other entity.

After the machine/computer learning components of the repair manager 310 have been trained the repair manager 310 is able to autonomously generate work orders for damaged/obstructed system components. The repair manager 310 stores the work orders as work order data 322. For example, the repair manager 310 takes as input and processes the inspection results data 338. If the repair manager 310 determines from the inspection results data 338 that a system component is experiencing a problem, the repair manager 310 initiates one or more autonomous work order generation processes.

Consider the example of inspection results data shown in FIG. 9. Upon processing this data, the repair manager 310 determines the component having the ID of CID_2 is experiencing a problem based on one or more of the Operational State entry, Damage Type entry, or the Damaged Part entry. The repair manager 310 processes the system component data 316 to identify a profile comprising a component ID matching the component ID identified within the inspection results data 338. In this example, the repair manager 310 determines that the system component experiencing a problem is a Type_B system component (e.g., a transformer). It should be noted that the component type information may also be included within the inspection results data 338.

The repair manager 310 then autonomously generates a work order for the transformer utilizing one or more of its machine learning components and stores this as work order data 322. For example, based on the system components and its attributes (e.g., type, location, configuration, etc.); damage and its attributes (e.g., type, location, cause, etc.); the specific parts of the system component that have been damaged; type of debris obstructing the system component and/or surrounding areas; and/or the like the repair manager 310 determines the parts; tools; equipment; vehicles; work crew type; specific work crew member; and/or the like required for repairing the transformer.

In some embodiments, the inspection results data 338 may not explicitly identify damaged parts of a system component, but may identify the cause of damage. For example, the type of damage may indicate that the transformer was struck by lightning. Therefore, the repair manager 310 may determine the parts that were most likely to be damaged by this event. Alternatively, the inspection results data 338 may explicitly identify the damaged parts. Based on the determination of these parts, the repair manager 310 is able to determine the tools and procedures for repairing or replacing these parts based on its machine learning components.

As discussed above, not only does the repair manager 310 determine the parts and tools required to repair system components but also determines the vehicles, equipment, and work crews required to repair the system component. For example, the repair manager 310 may process the AOI data 312, device data 314, and system component data 316 and determine that the AOI 312 in which the system component is located comprises specific terrain that requires a specific type of repair vehicle for safe travel. The repair manager 310 may also utilize this data to determine that the system component is at a given location and has a given configuration that requires a vehicle with a boom of a specific length. The repair manager 310 may further determine that the particular damage or system component requires a specialized crew. The repair manager 310 utilizes the above data to autonomously generate one or more work orders 322 for repairing or replacing a system component(s).

In some embodiments, the repair manager 310 autonomously provisions and/or assigns the required equipment, parts, tools, crews, etc. for a given work order. For example, once the repair manager 310 has determined which parts, equipment, tools, crews, etc. are required for servicing a system component the repair manager 310 may communicate with one or more information processing systems to provisions and/or assigns these items to the job. In some embodiments, the repair manager 310 may analyze parts data 324 to determine if the required parts are available. If not, the repair manager 310 may autonomously order the required parts. In addition, the repair manager 310 may communicate with an information processing system at a parts warehouse, dispatch terminal, and/or the like to autonomously provision available parts to the current job. For example, the repair manager 310 may communicate with one or more information processing systems managing the parts inventory and instructs these systems to provision the parts for the current job.

The repair manager 310 may also perform similar operations with respect to the required equipment and tools. For example, the equipment and tool data 326 may comprise data relating to the equipment and tools available to work crews such as a unique identifier of the equipment/tools; type of the equipment/tools; availability of the equipment/tools; location of the equipment/tools; features of the equipment/tools; and/or the like. The repair manager 310 processes this data to identify equipment and tools that satisfy the repair criteria determined by the repair manager 310. When the repair manager 310 identifies equipment and tools that satisfy the repair criteria the repair manager 310 may autonomously provision the equipment and tools for the job. For example, the repair manager 310 may communicate with one or more information processing systems managing the equipment/tool inventory and instructs these systems to provision the equipment/tools for the current job. One advantage of the autonomous provisioning discussed above is that the time to identify, retrieve, and prepare the required parts, equipment, and tools for a given work order is drastically reduced as compared to conventional systems.

The repair manager 310 may also process work crew data 328 to determine particular crews that have attributes and availability that satisfy criteria required to perform the repairs on the system components. For example, the work crew data 328 may include a unique identifier for each work crew; a unique identifier for each individual that is part of the crew; a current location and/or home base of the crew; a current location of each individual crew member and/or the individual's home base; the availability of the work crew and/or each crew member; the specialties of the work crew and/or each individual crew member; contact information for each crew member; and/or the like. The repair manager 310 processes the above data and selects one or more appropriate work crews, makes substitutions of crew members, and/or the like.

Consider an example were the system component to be repaired is a transmission line. The repair manager 310 processes the work crew data 328 to identify a work crew with a specialization in repairing transmission lines. The repair manager 310 may utilize the work crew data 328 to identify a work crew that has a home base closest to the transmission line or to identify another crew if the first crew is currently not available. The repair manager 310 may further utilize the work crew data 328 to determine if each crew member of the identified work crew is current available. If not, the repair manager 310 may substitute in another crew member based on his/her corresponding information within the work crew data 328. Once a crew and its members have been selected, the repair manager 310 may utilize the contact information (e.g., mobile phone number, landline phone number, email address, pager number, etc.) from the work crew data 328 to autonomously send one or more messages to the communication devices of the crew members. These messages at least inform the crew members that they are required to perform one or more jobs.

After the repair manager 310 has processed the inspection data 320, parts and equipment data 326, and/or work crew data 328 the repair manager 310 autonomously generates one or more work orders 322. The work order 322 may include data such as an identification of the system component to be repaired/replaced; the location of the system component; the problem associated with the system component; the cause of problem; the work crew(s) and its members assigned to perform the repair; repair/replacement instructions; equipment provisioned or required for the repair; parts provisioned or required for the repair; tools provisioned or required for the repair; current and/or expected weather at the location; and/or the like.

In one or more embodiments, the repair manager 310 establishes a communication with one or more information processing systems, user devices 116, and/or the like and transmits the generated work order(s) 322 to the devices. FIG. 10 shows one example of a work order 322 generated by the repair manager 310 being presented on a display 1002 of a user device 116. A user device 116 may include cellular telephones, mobile phones, smart phones, in-vehicle devices; two-way pagers, wireless messaging devices, wearable computing devices, laptop computers, tablet computers, desktop computers, personal digital assistants, a combination of these devices, and/or other similar devices.

In the example shown in FIG. 10, the work order 322 comprises a first row 1004 uniquely identifying the work order. A second row 1006 comprises the time and time associated with the work order 322. A third row 1008 identifies the system component associated with the work order 322, provides any details regarding the system component, and/or the like. A fourth row 1010 provides location information associated with the system component(s). A fifth row 1012 problems information regarding the problem associated with system component(s) such as damage, obstruction, etc. The problem information may also include any information determined by the inspection manager 308 such as location of damage, specific parts that are damaged, and/or the like.

A sixth row 1014 provides information identifying the cause of the problem being experienced by the system component(s). A seventh row 1016 identifies and provides information associated with the work crew(s) assigned to the work order. An eighth row 1018 provides instructions on how to repair/replace the system component(s). A tenth row 1020 identifies and provides information associated with the equipment/vehicles and tools required to repair/replace the system component(s). An eleventh row 1022 identifies and provides information associated with the parts required to repair/replace the system component(s). A twelfth row 1024 provides information regarding the past, current, and/or expected weather at the repair site. It should be noted that the work order 322 is not limited to the configuration and the information provided in FIG. 10.

In some embodiments, one or more of the work order entries 1004 to 1024 are selectable by a user to obtain additional information. For example, one or more items in the System Component(s) row 1008 may be selected by a user to view a schematic of the system component that is experiencing a problem. In one embodiment, when a user selects an item within System Component(s) row 1008 the user device 116 establishes a connection with the information processing system 114 (or another information processing system) to request the additional information. The information processing system 114 obtains the requested information and transmits it to the user device 116 for presentation to the user. In another embodiment, the repair manager 110 packages this information with the work order 322 prior to transmitting the work order 322 to the user device 116.

In another example, one or more items within the Location row 1010 may be selected to present an interactive map 330 associated with the system component(s) experiencing the problem. The interactive map 330 may be provided to the user device similar to the system component data discussed above. In addition, the information processing system 114 may act as a server for the interactive map 330, which is presented to a user through an application interface. As the user interacts with the map 330 the inspection manager 308 updates the maps and presents information accordingly. It should be noted that the inspection manager 308 is not limited to presenting the interactive map upon selection of an item within the work order 322. The inspection manager 308 may present the map 330 to a user independent of the work order 322.

Figure 11:
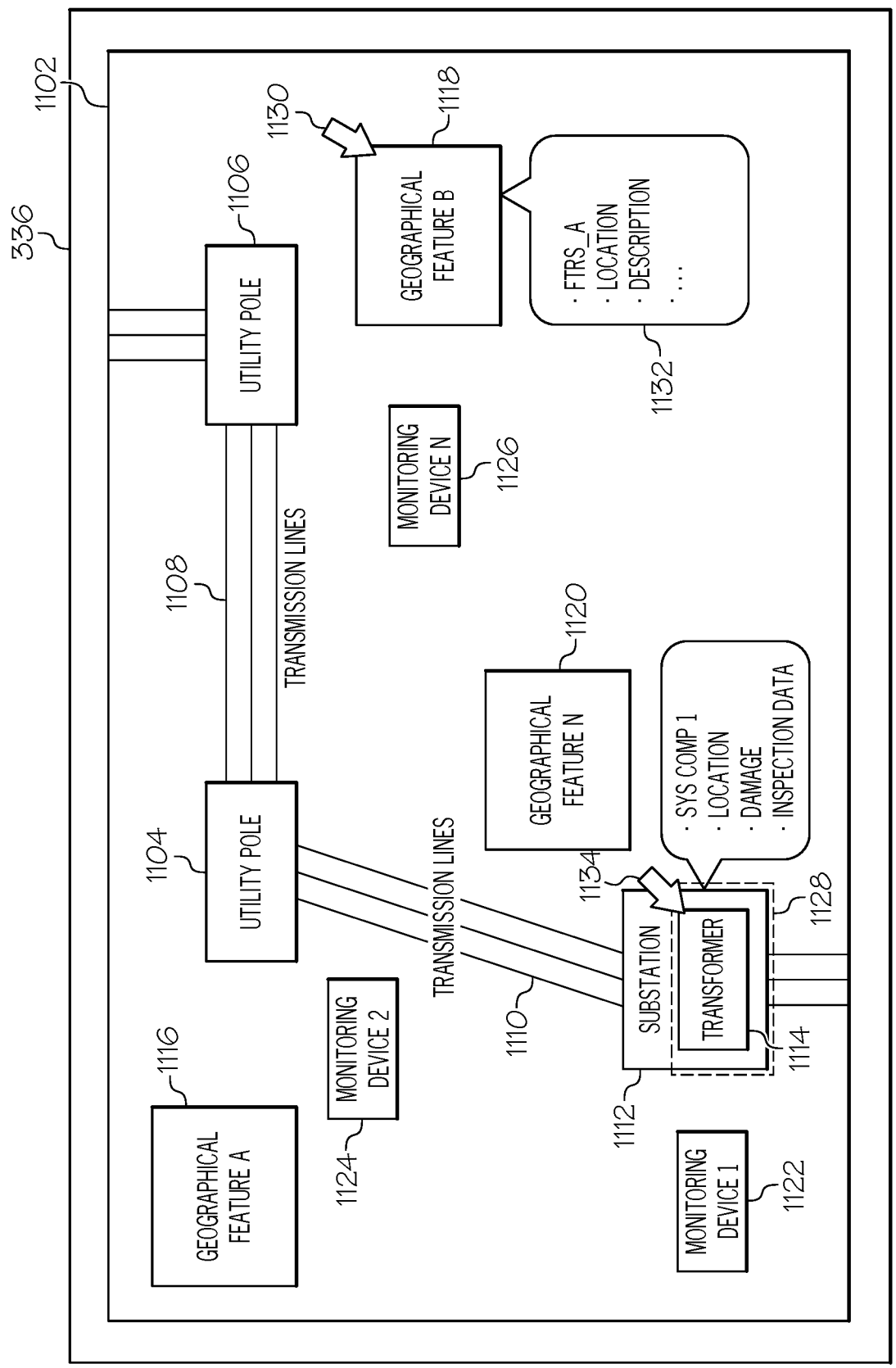
FIG. 11 is an illustrative example of an interactive map representing an area of interest; mobile unmanned monitoring devices; and system components according to one embodiment of the present invention.

FIG. 11 shows one example of an interactive map 330 generated by the inspection manager 308. In this example, the interactive map 330 displays the entire AOI comprising the system component associated with the work order 322. The user is able to zoom in and zoom out on the interactive map to obtain different granularities of information associated with the AOI, system components, topographical features, and/or the like. In the example of FIG. 11, the interactive map 330 comprises icons/widgets 1102 representing the AOI; system components 1104 to 1112; icons/widgets 1114 to 1120 representing geographical features; and icons/widgets 1122, 1124, 1126 representing the monitoring devices within the AOI. The inspection manager 308 generates and configures the icons/widgets or images representing these components to be selectable by a user. In one embodiment, the system components associated with the work order 322 are visually highlighted as illustrated by the dashed line 1128 surrounding the box 1114 representing a transformer.

The user is able to select one or more of the icons/widget presented within the interactive map 330. For example, FIG. 11 shows that when a user selects a geographical widget 1118, as represented by the arrow 1130, the inspection manager 308 may configure the interactive map 330 to display information 1132 such as an identifier of the features, the location of the topographical feature within the AOI; a type and description of the topographical feature; and/or the like. FIG. 11 also shows that when a system component widget 1114 is selected, as represented by the arrow 1134, the inspection manager may configure the interactive map 1100 to display information such as the component identifier; component location; component description; and/or the like. If the selected system component widget 1114 is associated with a work order 322, the interactive map 330 may also display information from the work order and/or inspection results data 338 such as identified damage, repair information, and/or the like. In addition, the work order 322 may also be presented to the user upon selection of a system component widget 1114 associated with the work order.

In one embodiment, when a user selects a system component widget 1114 associated with work order 322 and/or selects displayed information such as "damage", "inspection data", etc., the inspection manager 308 may configure the map 330 to present the user with the images, audio, sensor data, and/or the like utilized by inspection manager 308 to determine the component is experiencing a problem. This allows the crew members to review and familiarize themselves with the issue they have been assigned to address. In another embodiment, the interactive map 330 allows a user to select one or more of the widgets 1122 associated with a monitoring device. When the inspection manager 308 determines a user has selected a monitoring device widgets 1122, the inspection manager 308 configures the map 330 to present information associated with the device such as location, assigned system components, location, type, features, etc.

In addition, the inspection manager 308 may configure the monitoring device associated with the selected widget 1122 to be controlled by the user via his/her user device 116. In this embodiment, the map 330 may be configured to display a user interface to the user for controlling the monitoring device. This allows the user to control the device to obtain additional inspection data that the user may need to repair/ replace the system component. Any data captured monitoring device may be presented to the user through the user interface in real time as the user is controlling the device. In one embodiment, commands selected by the user through the user interface for controlling the monitoring device are transmitted to the inspection manager 308. The inspection manager 308 may then transmit these commands to the monitoring device. However, other mechanisms for controlling the monitoring device are applicable as well.

Figure 12:
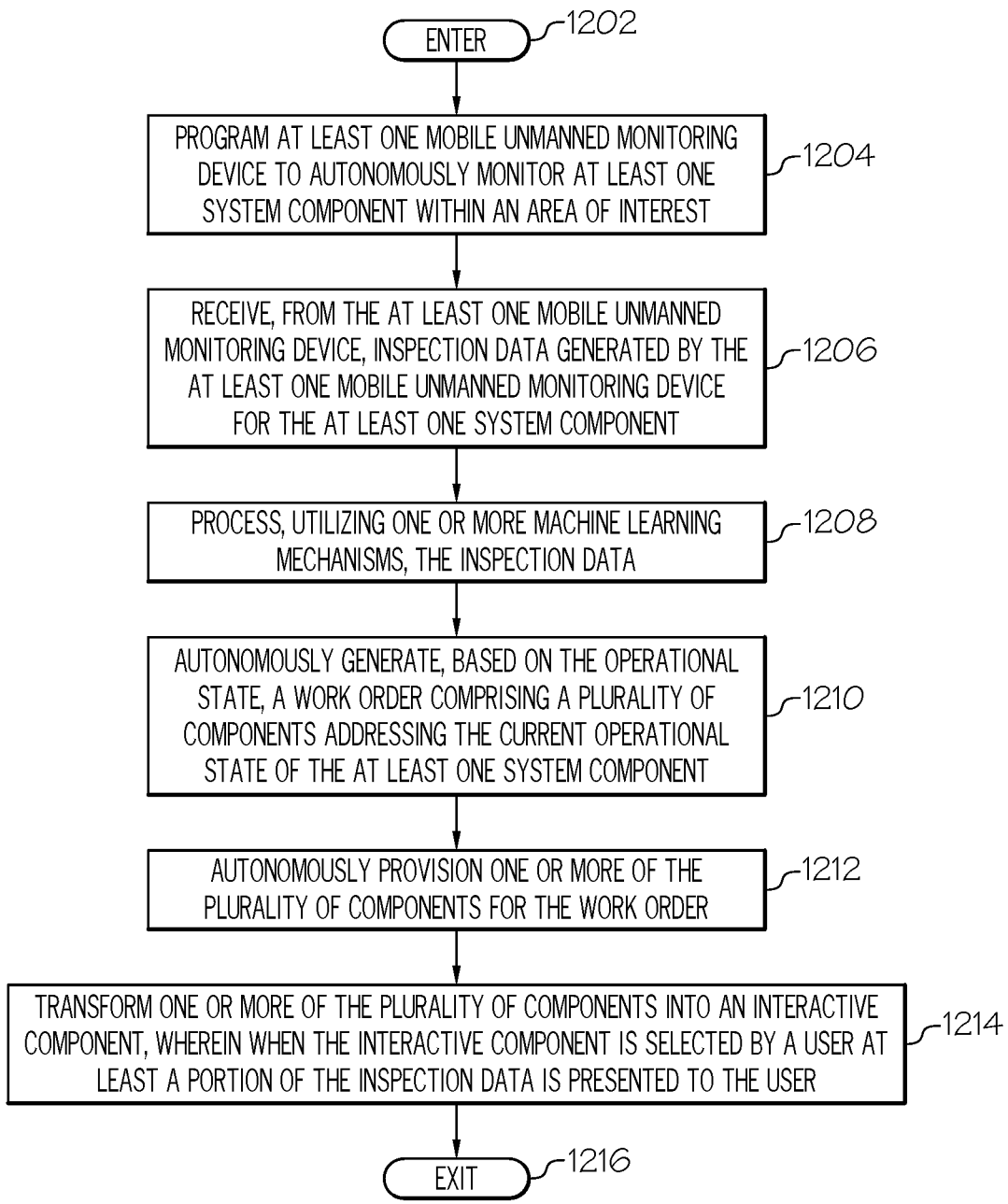
FIG. 12 is an operational flow diagram illustrating one example of managing autonomous inspections of system components within areas of interest according to one embodiment of the present invention.

FIG. 12 is an operational flow diagram illustrating one example of managing autonomous inspection of components within at least one area of interest. The operational flow diagram of FIG. 12 begins at step 1202 and flows directly to step 1204. The inspection manager 308, at step 1204 programs at least one mobile unmanned monitoring device to autonomously monitor at least one system component within an area of interest. For example, the inspection manager 308 may program the at least one mobile unmanned monitoring device with one or more inspection paths to be traversed by the at least one mobile unmanned monitoring device with respect to the at least one system component; one or more inspection parameters such as the type of data to capture; angles, resolution, etc. at which to capture images; time(s) at which to traverse the inspection path(s); and/or the like.

The inspection manager 308, at step 1206, receives inspection data from the receiving, from the at least one mobile unmanned monitoring device, inspection data generated by the at least one mobile unmanned monitoring device for the at least one system component. The at least one mobile unmanned monitoring device having generated the inspection data for the at least one system component. Examples of inspection data types include, but are not limited to, image data, audio data, and environmental sensor data captured by the at least one mobile unmanned monitoring and corresponding to the at least one system component.

The inspection manager 308, at step 1208, processes the inspection data utilizing one or more machine learning mechanisms. The inspection manager 310, at step 1210, determines a current operational state of the at least one system component based on processing the inspections data. In some embodiments, processing the inspection data further includes determining that additional inspection data is required, and electronically instructing the at least one mobile unmanned monitoring device (or another monitoring device(s)) to traverse one or more inspection paths and obtain additional inspection data with respect to the at least one system component. The inspection manager 308, at step 1210, autonomously generates a work order comprising a plurality of components addressing the current operational state of the at least one system component based on the operational state. In some embodiments, autonomously generating the work order comprises determining the current operational state of the at least one system component indicates the at least one system component has experienced damage; determining attributes of the damage; and determining, based on the attributes of the damage, one or more work crews required to repair the damage and at least one of a set of parts required to repair the damage, and a set of equipment required to repair the damage.

The inspection manager 308, at step 1212, autonomously provisions one or more of the plurality of components for the work order. In some embodiments autonomously provisioning one or more of the plurality of components transmitting a communication to at least one other information processing system indicating that the one or more plurality of components have been assigned to the work order. The communication may further comprise instructions for the one or more plurality of components to be sent to a given location. The inspection manager 308, at step 1214, transforms one or more of the plurality of components into an interactive component. When the interactive component is selected by a user at least a portion of the inspection data is presented to the user. The control flow then exits at step 1216.

Figure 13:
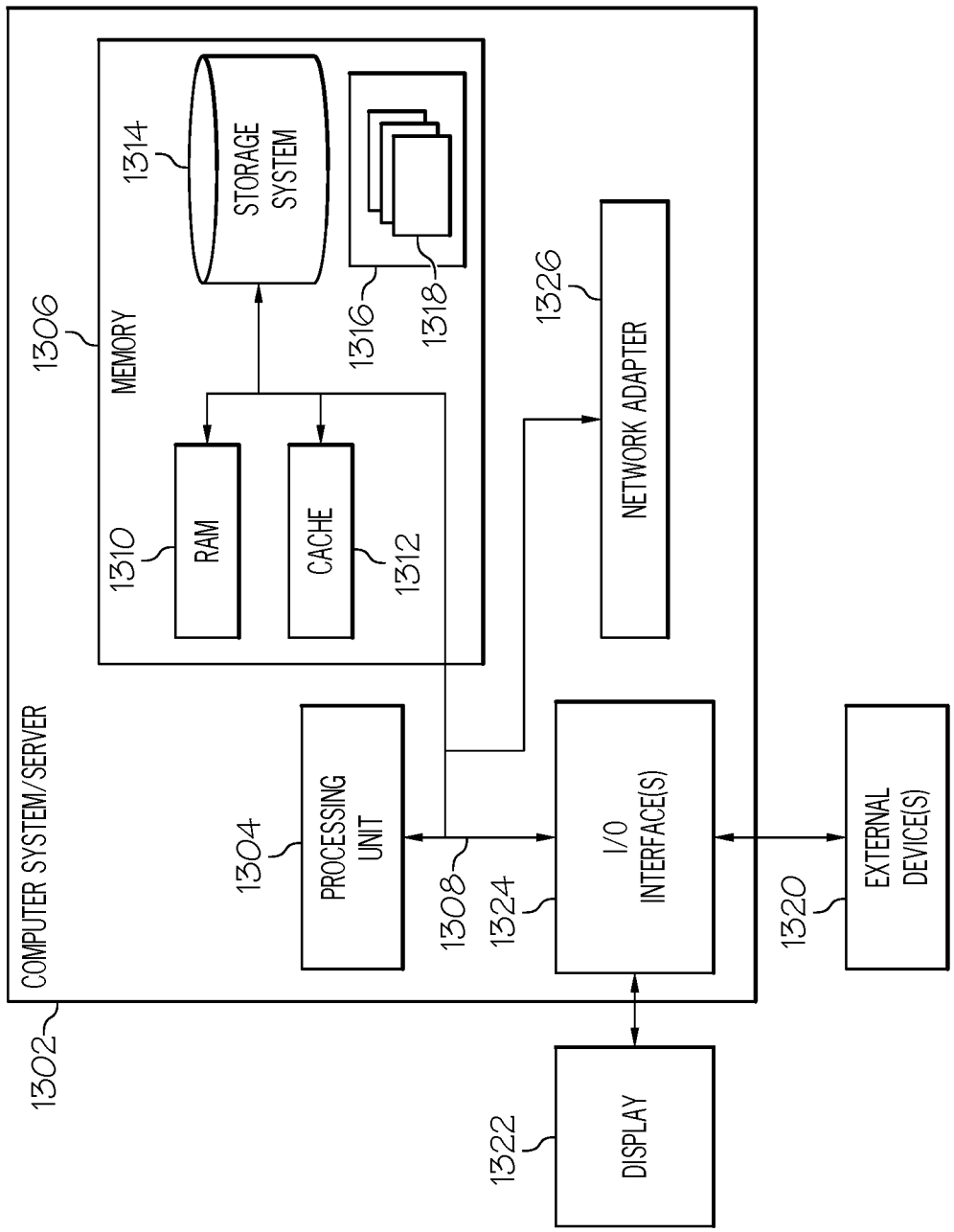
FIG. 13 is a block diagram illustrating another example of an information processing system according to one embodiment of the present invention.

Referring now to FIG. 13, this figure is a block diagram illustrating an information processing system that can be utilized in embodiments of the present invention. The information processing system 1302 is based upon a suitably configured processing system configured to implement one or more embodiments of the present invention such as the inspection manager 308 of FIG. 3. The components of the information processing system 1302 can include, but are not limited to, one or more processors or processing units 1304, a system memory 1306, and a bus 1308, which couples various system components including the system memory 1306 to the processor 1304. The bus 1308 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The system memory 1306 may include computer system readable media in the form of volatile memory, such as random access memory (RAM) 1310 and/or cache memory 1312. The information processing system 1302 can further include other removable/non-removable, volatile/non-volatile computer system storage media. By way of example only, a storage system 1314 can be provided for reading from and writing to a non-removable or removable, non-volatile media such as one or more solid state disks and/or magnetic media (typically called a "hard drive"). A magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus 1308 by one or more data media interfaces. The memory 1306 can include at least one program product having a set of program modules that are configured to carry out the functions of an embodiment of the present invention.

Program/utility 1316, having a set of program modules 1318, may be stored in memory 1306 by way of example, and not limitation, as well as an operating system, one or more application programs, other program modules, and program data. Each of the operating system, one or more application programs, other program modules, and program data or some combination thereof, may include an implementation of a networking environment. Program modules 1318 generally carry out the functions and/or methodologies of embodiments of the present invention.

The information processing system 1302 can also communicate with one or more external devices 1320 such as a keyboard, a pointing device, a display 1322, etc.; one or more devices that enable a user to interact with the information processing system 1302; and/or any devices (e.g., network card, modem, etc.) that enable computer system/server 1302 to communicate with one or more other computing devices. Such communication can occur via I/O interfaces 1324. Still yet, the information processing system 1302 can communicate with one or more networks such as a local area network (LAN), a general wide area network (WAN), and/or a public network (e.g., the Internet) via network adapter 1326. As depicted, the network adapter 1326 communicates with the other components of information processing system 1302 via the bus 1308. Other hardware and/or software components can also be used in conjunction with the information processing system 1302. Examples include, but are not limited to: microcode, device drivers, redundant processing units, external disk drive arrays, RAID systems, tape drives, and data archival storage systems.

As will be appreciated by one skilled in the art, aspects of the present invention may be embodied as a system, method, or computer program product. Accordingly, one or more aspects of the present invention may take the form of an entirely hardware embodiment, an entirely software embodiment (including firmware, resident software, micro-code, etc.) or an embodiment combining software and hardware aspects that may all generally be referred to herein as a "circuit", "module", or "system". Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been discussed above with reference to flowchart illustrations and/or block diagrams of methods, apparatus (systems) and computer program products according to various embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, by an information processing system, of managing an autonomous inspection of components within at least one area of interest, the method comprising:
   responsive to determining that a weather event is expected to occur within an area of interest comprising at least one system component, programming at least one mobile unmanned monitoring device (MUMD) to perform a first autonomous inspection of the at least one system component prior to the weather event occurring;
   receiving, from the at least one MUMD, a first set of inspection data generated by the at least one MUMD for the at least one system component based on the first autonomous inspection;
   responsive to determining that the weather event has occurred within the area of interest, determining that the at least one MUMD is scheduled to perform a second autonomous inspection of the at least one system component at a first time that is after a threshold amount of time has passed since the weather event has occurred;
   responsive to determining that the at least one MUMD is scheduled to perform the second autonomous inspection at the first time, programming the at least one MUMD to perform the second autonomous inspection of the at least one system component at a second time that is before the first time;
   receiving, from the at least one MUMD, a second set of inspection data generated by the at least one MUMD for the at least one system component based on the second autonomous inspection;
   determining a current operational state of the at least one system component based on the first set of inspection data and the second set of inspection data; and
   autonomously generating, based on the current operational state, a work order comprising a plurality of components addressing the current operational state of the at least one system component.

2. The method of claim 1, wherein programming at least one MUMD to perform one or more of the first autonomous inspection or the second autonomous inspection comprises:
   programming the at least one MUMD with
      one or more inspection paths to be traversed by the at least one MUMD with respect to the at least one system component, and
      one or more inspection parameters.

3. The method of claim 1, wherein at least one of first set of inspection data or the second set of inspection data comprises at least one or more of image data, audio data, and environmental sensor data captured by the at least one MUMD and corresponding to the at least one system component.

4. The method of claim 1, wherein determining the current operational state of the at least one system component comprises:
   determining that additional inspection data is required; and
   electronically instructing the at least one MUMD to traverse one or more inspection paths and obtain additional inspection data with respect to the at least one system component.

5. The method of claim 1, wherein the plurality of components at least comprises:
   an identification of the current operational state of the at least one system component;

an identification of one or more work crews assigned to the work order; and
an identification of a set of parts required for addressing the current operational state.

6. The method of claim 1, wherein determining the current operational state comprises at least one of:
   determining that the at least one system component is damaged;
   determining a type of the damage;
   determining a location of the damage; or
   one or more combinations thereof.

7. The method of claim 1, wherein autonomously generating the work order comprises:
   determining the current operational state of the at least one system component indicates the at least one system component has experienced damage;
   determining attributes of the damage; and
   determining, based on the attributes of the damage, one or more work crews required to repair the damage and at least one of
      a set of parts required to repair the damage,
      a set of equipment required to repair the damage, or
      a combination thereof.

8. The method of claim 1, further comprising:
   autonomously provisioning one or more of the plurality of components for the work order;
   presenting an interactive map of the area of interest including an interactive icon associated with the at least one system component;
   determining that a user has selected the interactive icon; and
   responsive to determining that the user has selected the interactive icon, presenting the inspection data for the at least one system component and one or more components of the plurality of components for the work order.

9. The method of claim 1, further comprising:
   transmitting a communication to at least one information processing system indicating that the one or more of the plurality of components have been assigned to the work order, wherein the communication further comprises instructions for the one or more plurality of components to be sent to a given location.

10. An information processing system for managing devices for managing an autonomous inspection of components within at least one area of interest, the information processing system comprising:
    a processor;
    memory communicatively coupled to the processor; and
    an inspection manager communicatively coupled to the processor and the memory that, when operating, is configured to:
       responsive to a determination that a weather event is expected to occur within an area of interest comprising at least one system component, program at least one mobile unmanned monitoring device (MUMD) to perform a first autonomous inspection of the at least one system component prior to the weather event occurring;
       receive, from the at least one MUMD, a first set of inspection data generated by the at least one MUMD for the at least one system component based on the first autonomous inspection;
       responsive to a determination that the weather event has occurred within the area of interest, determine that the at least one MUMD is scheduled to perform a second autonomous inspection of the at least one system component at a first time that is after a threshold amount of time has passed since the weather event has occurred;
       responsive to a determination that the at least one MUMD is scheduled to perform the second autonomous inspection at the first time, program the at least one MUMD to perform the second autonomous inspection of the at least one system component at a second time that is before the first time;
       receive, from the at least one MUMD, a second set of inspection data generated by the at least one MUMD for the at least one system component based on the second autonomous inspection;
       determine a current operational state of the at least one system component based on the first set of inspection data and the second set of inspection data; and
       autonomously generate, based on the current operational state, a work order comprising a plurality of components addressing the current operational state of the at least one system component.

11. The information processing system of claim 10, wherein the inspection manager is configured to program the at least one MUMD to perform one or more of the first autonomous inspection or the second autonomous inspection by:
    programming the at least one MUMD with
       one or more inspection paths to be traversed by the at least one MUMD with respect to the at least one system component, and
       one or more inspection parameters.

12. The information processing system of claim 10, wherein the inspection manager is further configured to:
    determine that additional inspection data is required; and
    electronically instruct the at least one MUMD to traverse one or more inspection paths and obtain additional inspection data with respect to the at least one system component.

13. The information processing system of claim 10, wherein the inspection manager is configured to autonomously generate the work order by:
    determining the current operational state of the at least one system component indicates the at least one system component has experienced damage;
    determining attributes of the damage; and
    determining, based on the attributes of the damage, one or more work crews required to repair the damage and at least one of
       a set of parts required to repair the damage,
       a set of equipment required to repair the damage, or
       a combination thereof.

14. The information processing system of claim 10, wherein the inspection manager is further configured to autonomously provision one or more components of the work order by:
    transmitting a communication to at least one information processing system that the one or more of the plurality of components have been assigned to the work order, wherein the communication further comprises instructions for the one or more plurality of components to be sent to a given location.

15. A computer program product for managing an autonomous inspection of components within at least one area of interest, the computer program product comprising:
    a computer readable storage medium having computer readable program code embodied therewith, the computer readable program code comprising instructions for:

selecting at least one mobile unmanned monitoring device (MUMD) from a plurality of MUMDs based on one or more attributes of the at least one MUMD and one or more attributes of at least one system component within an area of interest;

responsive to determining that a weather event is expected to occur within the area of interest, programming the at least one MUMD to perform a first autonomous inspection of the at least one system component prior to the weather event occurring;

receiving, from the at least one MUMD, a first set of inspection data generated by the at least one MUMD for the at least one system component based on the first autonomous inspection;

responsive to determining that the weather event has occurred within the area of interest, determining that the at least one MUMD is scheduled to perform a second autonomous inspection of the at least one system component at a first time that is after a threshold amount of time has passed since the weather event has occurred;

responsive to determining that the at least one MUMD is scheduled to perform the second autonomous inspection at the first time, programming the at least one MUMD to perform the second autonomous inspection of the at least one system component at a second time that is before the first time;

receiving, from the at least one MUMD, a second set of inspection data generated by the at least one MUMD for the at least one system component based on the second autonomous inspection;

processing, utilizing one or more machine learning mechanisms, the first set of inspection data and the second set of inspection data;

determining, based on the processing, a current operational state of the at least one system component;

autonomously generating, based on the current operational state, a work order comprising a plurality of components addressing the current operational state of the at least one system component; and autonomously provisioning one or more of the plurality of components for the work order.

16. The computer program product of claim 15, wherein programming the at least one MUMD to perform at least one of the first autonomous inspection or the second autonomous inspection comprises:

programming the at least one MUMD with
one or more inspection paths to be traversed by the at least one MUMD with respect to the at least one system component, and
one or more inspection parameters.

17. The computer program product of claim 15, wherein the computer readable program code further comprises instructions for:

determining that additional inspection data is required; and electronically instruct the at least one MUMD to traverse one or more inspection paths and obtain additional inspection data with respect to the at least one system component.

18. The computer program product of claim 15, wherein autonomously generating the work order comprises:

determining the current operational state of the at least one system component indicates the at least one system component has experienced damage;

determining attributes of the damage; and determining, based on the attributes of the damage, one or more work crews required to repair the damage and at least one of a set of parts required to repair the damage, a set of equipment required to repair the damage, or a combination thereof.

19. The computer program product of claim 15, wherein autonomously provisioning one or more components of the work order comprises:

transmitting a communication to at least one information processing system that the one or more of the plurality of components have been assigned to the work order, wherein the communication further comprises instructions for the one or more plurality of components to be sent to a given location.

20. The computer program product of claim 15, wherein autonomously generating the work order comprises:

determining the current operational state indicates that the at least one system component is damaged but is absent an identification of a specific component of the at least one system component that is damaged;

responsive to the current operational state being absent an identification of a specific component of the at least one system component that is damaged, predicting, based on the weather event and the second set of inspection data, one or more components of the at least one system component that are damaged; and autonomously generating the work order based on the predicted one or more components of the at least one system component that are damaged.

* * * * *